(12) United States Patent
Kyono et al.

(10) Patent No.: US 8,357,946 B2
(45) Date of Patent: Jan. 22, 2013

(54) NITRIDE SEMICONDUCTOR LIGHT EMITTING DEVICE, EPITAXIAL SUBSTRATE, AND METHOD FOR FABRICATING NITRIDE SEMICONDUCTOR LIGHT EMITTING DEVICE

(75) Inventors: Takashi Kyono, Itami (JP); Yusuke Yoshizumi, Itami (JP); Yohei Enya, Itami (JP); Katsushi Akita, Itami (JP); Masaki Ueno, Itami (JP); Takamichi Sumitomo, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/189,194

(22) Filed: Jul. 22, 2011

(65) Prior Publication Data

US 2011/0309328 A1 Dec. 22, 2011

Related U.S. Application Data

(63) Continuation of application No. PCT/JP2009/071788, filed on Dec. 28, 2009.

(30) Foreign Application Priority Data

Jan. 23, 2009 (JP) ............................... P2009-013307
Jul. 15, 2009 (JP) ............................... P2009-167084

(51) Int. Cl.
*H01L 27/15* (2006.01)
(52) U.S. Cl. ........................................ 257/94; 438/47
(58) Field of Classification Search .................... 257/11, 257/13, 14, 15, 79, 94, 97, E33.02, E33.027, 257/E33.028, E21.09, E21.108, E21.117; 438/22, 28, 29, 69, 47, 481, 956
See application file for complete search history.

(56) References Cited

U.S. PATENT DOCUMENTS

| 6,072,197 A | 6/2000 | Horino et al. |
|---|---|---|
| 2008/0107144 A1* | 5/2008 | Czeslaw et al. ............. 372/50.1 |
| 2009/0026440 A1* | 1/2009 | Kyono et al. ................... 257/13 |
| 2009/0039364 A1* | 2/2009 | Kang et al. ....................... 257/96 |
| 2009/0212277 A1* | 8/2009 | Akita et al. ...................... 257/13 |

FOREIGN PATENT DOCUMENTS

| CN | 1515036 A | 7/2004 |
|---|---|---|
| CN | 101123292 A | 2/2008 |

(Continued)

*Primary Examiner* — Olik Chaudhuri
*Assistant Examiner* — Su Kim
(74) *Attorney, Agent, or Firm* — Venable LLP; Michael A. Sartori

(57) ABSTRACT

Provided is a nitride semiconductor light emitting device including a light emitting layer above a GaN support base with a semipolar surface and allowing for suppression of reduction in luminous efficiency due to misfit dislocations. A nitride semiconductor light emitting device 11 has a support base 13 comprised of a hexagonal gallium nitride, an n-type gallium nitride-based semiconductor layer 15 including an $In_{X1}Al_{Y1}Ga_{1-X1-Y1}N$ ($0<X1<1$, $0<Y1<1$, $X1+Y1<1$) layer 21, a light emitting layer 17, and a p-type gallium nitride-based semiconductor layer 19. This InAlGaN layer 21 is provided between a semipolar primary surface 13a and the light emitting layer 17. Since the bandgap E of the InAlGaN layer 21 is not less than the bandgap E of gallium nitride, a confinement effect of carriers and light in the light emitting layer 17 is provided. A c-plane Sc2 of the InAlGaN layer 21 is inclined relative to a normal axis Ax, but a density of misfit dislocations due to a slip plane consisting primarily of the c-plane is reduced as compared to AlGaN.

39 Claims, 14 Drawing Sheets

FOREIGN PATENT DOCUMENTS

| | | |
|---|---|---|
| JP | 10-004244 A2 | 1/1998 |
| JP | 10-135576 A2 | 5/1998 |
| JP | 2002-335052 A2 | 11/2002 |
| JP | 2003-298192 | 10/2003 |
| JP | 2008-060375 | 3/2008 |
| JP | 2008-277865 A2 | 11/2008 |

* cited by examiner (a)

(b)

(a)

(b)

(a)

(b)

(c)

(a)

(b)

NITRIDE SEMICONDUCTOR LIGHT EMITTING DEVICE, EPITAXIAL SUBSTRATE, AND METHOD FOR FABRICATING NITRIDE SEMICONDUCTOR LIGHT EMITTING DEVICE

CROSS REFERENCE TO RELATED APPLICATIONS

This is a continuation application of a PCT application No. PCT/JP2009/071788 filed on Dec. 28, 2009, claiming the benefit of priorities from Japanese Patent application No. 2009-013307 filed on Jan. 23, 2009 and Japanese Patent application No. 2009-167084 filed on Jul. 15, 2009, and incorporated by reference in their entirety.

TECHNICAL FIELD

The present invention relates to a nitride semiconductor light emitting device, an epitaxial substrate, and a method for fabricating the nitride semiconductor light emitting device.

BACKGROUND ART

Patent Document 1 describes a nitride semiconductor laser. The nitride semiconductor laser has an active layer to emit light a wavelength of in the ultraviolet region of not more than 375 nm. This active layer is formed on a GaN substrate. The active layer of the nitride semiconductor laser is disposed between a lower cladding layer and an upper cladding layer. At least one of the lower cladding layer and the upper cladding layer includes an AlInGaN layer and an AlGaN layer.

PRIOR ART DOCUMENT

Patent Document

Patent Document 1: Japanese Patent Application Laid-open No. 2002-335052

SUMMARY OF THE INVENTION

Problem to be Solved by the Invention

A nitride semiconductor light emitting device can be made on a semipolar plane, different from the ultraviolet semiconductor laser of Patent Document 1. In fabrication of this nitride semiconductor light emitting device, when a GaN-based semiconductor layer is grown on the semipolar surface of the GaN substrate, a c-plane of the GaN-based semiconductor layer is inclined relative to a normal axis normal to the semipolar surface.

When the GaN-based semiconductor layer is made of a semiconductor different from the GaN substrate, e.g., an AlGaN layer, AlGaN includes internal strain because of lattice mismatch between GaN and AlGaN. According to the inventors' knowledge, strained AlGaN on the semipolar plane can introduce misfit dislocations by use of a c-plane slip plane to release the strain. On the other hand, when the AlInGaN semiconductor layer or the AlGaN semiconductor layer is grown on the GaN substrate in the ultraviolet semiconductor laser of Patent Document 1, the c-plane of these GaN-based semiconductor layers extends in parallel with the surface of the GaN substrate. Hence, there are no misfit dislocations due to the c-plane slip plane in the AlGaN semiconductor layer on the c-plane GaN substrate.

According to the inventors' knowledge, when the nitride semiconductor light emitting device includes the light emitting layer provided on the AlGaN layer that is lattice-relaxed by misfit dislocations, the luminous efficiency thereof becomes lower than with the light emitting layer provided on the strained AlGaN layer.

The present invention has been accomplished in view of the above-described circumstances. It is an object of the present invention to provide a nitride semiconductor light emitting device including a light emitting layer on a GaN support base with a semipolar plane and allowing for suppression of the reduction in luminous efficiency due to misfit dislocations. It is another object of the present invention to provide an epitaxial substrate for the nitride semiconductor light emitting device. It is a further object of the present invention to provide a method for fabricating the nitride semiconductor light emitting device.

Means for Solving the Problem

One aspect of the present invention relates to a nitride semiconductor light emitting device. This nitride semiconductor light emitting device comprises: (a) a support base comprising a hexagonal gallium nitride, the support base including a semipolar primary surface inclined with respect to a plane perpendicular to a c-axis of the hexagonal gallium nitride; (b) a light emitting layer provided on the support base, the light emitting layer comprising a gallium nitride-based semiconductor; (c) an $In_{X1}Al_{Y1}Ga_{1-X1-Y1}N$ ($0<X1<1$, $0<Y1<1$, $X1+Y1<1$) layer provided between the support base and the light emitting layer; and (d) a p-type gallium nitride-based semiconductor layer. The support base, the $In_{X1}Al_{Y1}Ga_{1-X1-Y1}N$ layer, the light emitting layer, and the p-type gallium nitride-based semiconductor layer are arranged in order along a normal axis to the semipolar surface of the support base; the light emitting layer has a quantum well structure comprising an InGaN layer; a thickness of the $In_{X1}Al_{Y1}Ga_{1-X1-Y1}N$ layer is larger than a thickness of the quantum well structure; a bandgap of the $In_{X1}Al_{Y1}Ga_{1-X1-Y1}N$ layer is not less than a bandgap of the hexagonal gallium nitride; the $In_{X1}Al_{Y1}Ga_{1-X1-Y1}N$ layer is doped with an n-type dopant; and a c-plane of the $In_{X1}Al_{Y1}Ga_{1-X1-Y1}N$ layer being inclined with respect to the normal axis.

In this nitride semiconductor light emitting device, the $In_{X1}Al_{Y1}Ga_{1-X1-Y1}N$ layer is provided between the InGaN layer of the light emitting layer and the support base. Since the bandgap of the $In_{X1}Al_{Y1}Ga_{1-X1-Y1}N$ layer is not less than the bandgap of the hexagonal gallium nitride, the nitride semiconductor light emitting device is provided with the confinements of carriers and light into the light emitting layer. Since the $In_{X1}Al_{Y1}Ga_{1-X1-Y1}N$ layer is thicker than the quantum well structure, misfit dislocations are likely to occur in AlGaN having the equivalent of the bandgap of the $In_{X1}Al_{Y1}Ga_{1-X1-Y1}N$ layer. Although the c-plane of the $In_{X1}Al_{Y1}Ga_{1-X1-Y1}N$ layer is inclined with respect to the normal axis, adjustment of lattice constants based on the composition of the quaternary $In_{X1}Al_{Y1}Ga_{1-X1-Y1}N$ layer can reduce the density of misfit dislocations due to the formation of the slip plane by use of c-plane, when compared to AlGaN.

Another aspect of the present invention relates to an epitaxial substrate for the nitride semiconductor light emitting device. This epitaxial substrate comprises: (a) a substrate comprising a hexagonal gallium nitride and, the substrate including a semipolar primary surface inclined with respect to a plane perpendicular to a c-axis of the hexagonal gallium nitride; (b) a light emitting layer provided on the substrate, the light emitting layer comprising a gallium nitride-based semiconductor; (c) an $In_{X1}Al_{Y1}Ga_{1-X1-Y1}N$ (0<X1<1, 0<Y1<1, X1+Y1<1) layer provided between the substrate and the light emitting layer; and (d) a p-type gallium nitride-based semiconductor layer. The substrate, the $In_{X1}Al_{Y1}Ga_{1-X1-Y1}N$ layer, the light emitting layer, and the p-type gallium nitride-based semiconductor layer are arranged in order along a normal axis to the semipolar surface of the substrate; the light emitting layer has a quantum well structure comprising an InGaN layer; a thickness of the $In_{X1}Al_{Y1}Ga_{1-X1-Y1}N$ layer is larger than a thickness of the quantum well structure; a bandgap of the $In_{X1}Al_{Y1}Ga_{1-X1-Y1}N$ layer is not less than a bandgap of the hexagonal gallium nitride; the $In_{X1}Al_{Y1}Ga_{1-X1-Y1}N$ layer is doped with an n-type dopant; and a c-plane of the $In_{X1}Al_{Y1}Ga_{1-X1-Y1}N$ layer being inclined relative to the normal axis.

In this epitaxial substrate, the $In_{X1}Al_{Y1}Ga_{1-X1-Y1}N$ layer is provided between the InGaN layer of the light emitting layer and the substrate. Since the bandgap of the $In_{X1}Al_{Y1}Ga_{1-X1-Y1}N$ layer is not less than the bandgap of the hexagonal gallium nitride, the nitride semiconductor light emitting device from the epitaxial substrate is provided with the confinements of carriers and light into the light emitting layer. Since the $In_{X1}Al_{Y1}Ga_{1-X1-Y1}N$ layer is thicker than the quantum well structure, misfit dislocations are likely to occur in AlGaN having the equivalent of the bandgap of the $In_{X1}Al_{Y1}Ga_{1-X1-Y1}N$ layer. Although the c-plane of the $In_{X1}Al_{Y1}Ga_{1-X1-Y1}N$ layer is inclined with respect to the normal axis, adjustment of lattice constants based on the composition of the quaternary $In_{X1}Al_{Y1}Ga_{1-X1-Y1}N$ layer can reduce the density of misfit dislocations due to the formation of the slip plane by use of c-plane, when compared to AlGaN.

Each of the aspects of the present invention can further comprise an $In_{X2}Al_{Y2}Ga_{1-X2-Y2}N$ (0<X2<1, 0<Y2<1, X2+Y2<1) layer provided between the p-type gallium nitride-based semiconductor layer and the light emitting layer. The $In_{X2}Al_{Y2}Ga_{1-X2-Y2}N$ layer is an electron block layer, and a c-plane of the $In_{X2}Al_{Y2}Ga_{1-X2-Y2}N$ layer is inclined with respect to the normal axis.

Since the $In_{X2}Al_{Y2}Ga_{1-X2-Y2}N$ layer corresponds to the electron block layer, misfit dislocations are reduced at a junction between the $In_{X2}Al_{Y2}Ga_{1-X2-Y2}N$ layer and the light emitting layer.

Still another aspect of the present invention relates to a method for fabricating the nitride semiconductor light emitting device. This method comprises the steps of: (a) preparing a substrate, the substrate comprising a hexagonal gallium nitride and having a semipolar primary surface inclined with respect to a plane perpendicular to a c-axis of the hexagonal gallium nitride; (b) growing an $In_{X1}Al_{Y1}Ga_{1-X1-Y1}N$ cladding (0<X1<1, 0<Y1<1, X1+Y1<1) layer on the semipolar surface of the substrate while doping the $In_{X1}Al_{Y1}Ga_{1-X1-Y1}N$ cladding layer with an n-type dopant; (c) forming a light emitting layer on the $In_{X1}Al_{Y1}Ga_{1-X1-Y1}N$ cladding layer, the light emitting layer comprising a gallium nitride-based semiconductor; (d) growing an $In_{X2}Al_{Y2}Ga_{1-X2-Y2}N$ electron block (0<X2<1, 0<Y2<1, X2+Y2<1) layer on the light emitting layer; and (e) growing an $In_{X3}Al_{Y3}Ga_{1-X3-Y3}N$ cladding (0<X3<1, 0<Y3<1, X3+Y3<1) layer on the $In_{X2}Al_{Y2}Ga_{1-X2-Y2}N$ electron block layer while doping the $In_{X3}Al_{Y3}Ga_{1-X3-Y3}N$ cladding layer with a p-type dopant. The light emitting layer has a quantum well structure comprising an InGaN layer; a thickness of the $In_{X1}Al_{Y1}Ga_{1-X1-Y1}N$ cladding layer is larger than a thickness of the quantum well structure; a bandgap of the $In_{X1}Al_{Y1}Ga_{1-X1-Y1}N$ cladding layer is not less than a bandgap of the hexagonal gallium nitride; a c-plane of the $In_{X1}Al_{Y1}Ga_{1-X1-Y1}N$ cladding layer is inclined relative to the normal axis; a c-plane of the $In_{X2}Al_{Y2}Ga_{1-X2-Y2}N$ electron block layer is inclined relative to the normal axis, and a c-plane of the $In_{X3}Al_{Y3}Ga_{1-X3-Y3}N$ cladding layer is inclined relative to the normal axis.

In this method, the quaternary $In_{X1}Al_{Y1}Ga_{1-X1-Y1}N$ layer is formed on the substrate. Although the c-plane of the $In_{X1}Al_{Y1}Ga_{1-X1-Y1}N$ layer is inclined relative to the normal axis, adjustment of lattice constants based on the composition of the quaternary $In_{X1}Al_{Y1}Ga_{1-X1-Y1}N$ layer can reduce the density of misfit dislocations due to the formation of the slip plane through c-plane, when compared to AlGaN. The InGaN layer for the light emitting layer can be formed on this $In_{X1}Al_{Y1}Ga_{1-X1-Y1}N$ layer, thereby suppressing the reduction in luminous efficiency of the light emitting layer.

The method according to the present invention can be implemented as follows: a growth temperature for the $In_{X2}Al_{Y2}Ga_{1-X2-Y2}N$ electron block layer is not less than 800 Celsius degrees and not more than 900 Celsius degrees, and a growth temperature for the $In_{X3}Al_{Y3}Ga_{1-X3-Y3}N$ cladding layer is not less than 800 Celsius degrees and not more than 900 Celsius degrees. In this method, since the electron block layer and the cladding layer are grown at the growth temperature in the range of not less than 800 Celsius degrees and not more than 900 Celsius degrees after the growth of the light emitting layer, this growth temperature is lower than that of an electron block layer and a cladding layer which are made of AlGaN. Use of the growth temperature can reduce thermal stress, applied to the light emitting layer, from the growth of the electron block layer and cladding layer.

The method according to the present invention can further comprise the step of growing a p-type gallium nitride-based semiconductor layer on the $In_{X3}Al_{Y3}Ga_{1-X3-Y3}N$ cladding layer. A growth temperature of the p-type gallium nitride-based semiconductor layer is not less than 800 Celsius degrees and not more than 900 Celsius degrees. In this method, the p-type gallium nitride-based semiconductor layer formed after the growth of the light emitting layer is grown at the growth temperature of not less than 800 Celsius degrees and not more than 900 Celsius degrees, thereby reducing thermal stress on the light emitting layer during the growth of the p-type gallium nitride-based semiconductor.

In each of the aspects of the present invention, a c-axis direction in the hexagonal gallium nitride and a magnitude of a lattice constant d0 thereof in the c-axis direction thereof are represented by a lattice vector LVC0; a c-axis direction of a semiconductor material for the $In_{X1}Al_{Y1}Ga_{1-X1-Y1}N$ layer and a magnitude of a lattice constant d1 thereof in the c-axis direction thereof are represented by a lattice vector LVC1; the lattice vector LVC0 has a longitudinal component $V0_L$ in a direction of the normal axis and a transverse component $V0_T$ perpendicular to the longitudinal component; the lattice vector LVC1 has a longitudinal component $V1_L$ in the direction of the normal axis and a transverse component $V1_T$ perpendicular to the longitudinal component; a lattice mismatch degree in a transverse direction $(V1_T - V0_T)/V0_T$ is not less than $-0.15\%$; and the lattice mismatch degree $(V1_T - V0_T)/V0_T$ is not more than $0.2\%$.

The $In_{X1}Al_{Y1}Ga_{1-X1-Y1}N$ layer providing this lattice mismatch degree can reduce the misfit dislocation density at the interface between the $In_{X1}Al_{Y1}Ga_{1-X1-Y1}N$ layer and the underlying layer because the lattice constant of $In_{X1}Al_{Y1}Ga_{1-X1-Y1}N$ is close to that of GaN. Introduction of misfit dislocations is reduced in the range where the lattice mismatch between quaternary InAlGaN and GaN is kept small.

In each of the aspects of the present invention, a direction of inclination of the semipolar primary surface is a direction from the c-axis of the hexagonal gallium nitride to one of an a-axis and an m-axis of the hexagonal gallium nitride; a direction of a first crystal axis of the hexagonal gallium nitride and a magnitude of a lattice constant d0N of the hexagonal gallium nitride in the direction of the first crystal axis are represented by a lattice vector LVN0, and the first crystal axis is another of the a-axis and the m-axis of the hexagonal gallium nitride; a direction of a second crystal axis of a semiconductor material for the $In_{X1}Al_{Y1}Ga_{1-X1-Y1}N$ layer and a magnitude of a lattice constant d1N of the semiconductor material for the $In_{X1}Al_{Y1}Ga_{1-X1-Y1}N$ layer in the direction of the second crystal axis are represented by a lattice vector LVN1 and the second crystal axis is another of the a-axis and the m-axis of the semiconductor material for the $In_{X1}Al_{Y1}Ga_{1-X1-Y1}N$ layer; the lattice vector LVN0 has a longitudinal component $V0N_L$ in a direction of the normal axis and a transverse component $V0N_T$ perpendicular to the longitudinal component; the lattice vector LVN1 has a longitudinal component $V1N_L$ in the direction of the normal axis and a transverse component $V1N_T$ perpendicular to the longitudinal component; a lattice mismatch degree in a transverse direction $(V1N_T-V0N_T)/V0N_T$ is not less than −0.15%; and the lattice mismatch degree $(V1N_T-V0N_T)/V0N_T$ is not more than 0.2%.

In the $In_{X1}Al_{Y1}Ga_{1-X1-Y1}N$ layer providing this lattice mismatch degree, when the inclination direction of the semipolar primary surface is a direction to one of the a-axis and the m-axis, the lattice constant of $In_{X1}Al_{Y1}Ga_{1-X1-Y1}N$ on the other of the a-axis and the m-axis is close to that of GaN, and therefore the misfit dislocation density can be reduced at the interface between the $In_{X1}Al_{Y1}Ga_{1-X1-Y1}N$ layer and the underlying layer. The introduction of misfit dislocations is reduced in the above range where the lattice mismatch between quaternary InAlGaN and GaN is kept small.

In each aspect of the present invention, the lattice mismatch degree $(V1_T-V0_T)/V0_T$ is not more than 0% and the lattice mismatch degree $(V1N_T-V0N_T)/V0N_T$ is not less than 0%.

In the $In_{X1}Al_{Y1}Ga_{1-X1-Y1}N$ layer, the lattice match condition in the direction parallel to the inclination direction of the semipolar primary surface and the lattice match condition in the direction perpendicular to the off direction are different from each other. According to the inventors' knowledge, the lattice mismatch degrees in these two directions in the $In_{X1}Al_{Y1}Ga_{1-X1-Y1}N$ layer providing the lattice mismatch degrees are defined as follows: the lattice mismatch degree $(V1_T-V0_T)/V0_T$ is not less than −0.15% and not more than 0%; and the lattice mismatch degree $(V1N_T-V0N_T)/V0N_T$ is not less than 0% and not more than 0.2%. In these lattice mismatch degree ranges, excellent device characteristics are provided.

In each aspect of the present invention, a direction of inclination of the semipolar primary surface can be a direction from the c-axis of the hexagonal gallium nitride to the a-axis of the hexagonal gallium nitride. Alternatively, the direction of inclination of the semipolar primary surface can be a direction from the c-axis of the hexagonal gallium nitride to the m-axis of the hexagonal gallium nitride.

In each aspect of the present invention, a c-axis direction in the hexagonal gallium nitride and a magnitude of a lattice constant d0 thereof in the c-axis direction are represented by a lattice vector LVC0; a c-axis direction of a semiconductor material for the $In_{X1}Al_{Y1}Ga_{1-X1-Y1}N$ layer and a magnitude of a lattice constant d1 of the semiconductor material for the $In_{X1}Al_{Y1}Ga_{1-X1-Y1}N$ layer in the c-axis direction are represented by a lattice vector LVC1; the lattice vector LVC0 has a longitudinal component $V0_L$ in a direction of the normal axis and a transverse component $V0_T$ perpendicular to the longitudinal component; the lattice vector LVC1 has a longitudinal component $V1_L$ in the direction of the normal axis and a transverse component $V1_T$ perpendicular to the longitudinal component; a lattice mismatch degree in a transverse direction $(V1_T-V0_T)/V0_T$ is not less than −0.15%; the lattice mismatch degree $(V1_T-V0_T)/V0_T$ is not more than 0%; a direction of a crystal axis perpendicular to the normal axis and the c-axis of the hexagonal gallium nitride, and a magnitude of a lattice constant d0N of the crystal axis thereof in the direction of the crystal axis are represented by a lattice vector LVN0; a direction of a crystal axis perpendicular to the normal axis and the c-axis of the semiconductor material for the $In_{X1}Al_{Y1}Ga_{1-X1-Y1}N$ layer and a magnitude of a lattice constant d1N of the semiconductor material for the $In_{X1}Al_{Y1}Ga_{1-X1-Y1}N$ layer in the direction of the crystal axis are represented by a lattice vector LVN1; the lattice vector LVN0 has a longitudinal component $V0N_L$ in a direction of the normal axis and a transverse component $V0N_T$ perpendicular to the longitudinal component; the lattice vector LVN1 has a longitudinal component $V1N_L$ in the direction of the normal axis and a transverse component $V1N_T$ perpendicular to the longitudinal component; a lattice mismatch degree in a transverse direction $(V1N_T-V0N_T)/V0N_T$ is not less than 0%; and the lattice mismatch degree $(V1N_T-V0N_T)/V0N_T$ is not more than 0.2%.

In the $In_{X1}Al_{Y1}Ga_{1-X1-Y1}N$ layer, the lattice match condition in the direction parallel to the inclination direction of the semipolar primary surface and the lattice match condition in the direction perpendicular to its off direction are different from each other. In the foregoing ranges of the lattice mismatch degree, excellent device characteristics are provided.

In each aspect of the present invention, an In composition X1 of the $In_{X1}Al_{Y1}Ga_{1-X1-Y1}N$ layer is not less than 0.01, and the In composition X1 of the $In_{X1}Al_{Y1}Ga_{1-X1-Y1}N$ layer can be not more than 0.06. In this composition range, the lattice constant of InAlGaN can be made closer to that of GaN, and this In composition range is useful for providing InAlGaN with a bandgap for the cladding layer.

In each aspect of the present invention, an Al composition Y1 of the $In_{X1}Al_{Y1}Ga_{1-X1-Y1}N$ layer is not less than 0.05, and the Al composition Y1 of the $In_{X1}Al_{Y1}Ga_{1-X1-Y1}N$ layer can be not more than 0.30. This Al composition range is useful for providing InAlGaN with a bandgap for the cladding layer.

In each aspect of the present invention, a bandgap energy of the $In_{X1}Al_{Y1}Ga_{1-X1-Y1}N$ layer is not less than 3.51 electron volts, and the bandgap energy of the $In_{X1}Al_{Y1}Ga_{1-X1-Y1}N$ layer can be not more than 3.63 electron volts.

This bandgap energy range can make the lattice constant of quaternary InAlGaN closer to that of GaN and provide the $In_{X1}Al_{Y1}Ga_{1-X1-Y1}N$ layer with the refractive index for cladding.

In each aspect of the present invention, a thickness of the $In_{X1}Al_{Y1}Ga_{1-X1-Y1}N$ layer is not more than 3 μm, and the $In_{X1}Al_{Y1}Ga_{1-X1-Y1}N$ layer can constitute at least a part of an n-type cladding layer. This $In_{X1}Al_{Y1}Ga_{1-X1-Y1}N$ layer of a thickness in this range acts as the cladding layer useful for optical confinement.

In each aspect of the present invention, the $In_{X1}Al_{Y1}Ga_{1-X1-Y1}N$ layer makes a first junction with the support base (or with the substrate), the $In_{X1}Al_{Y1}Ga_{1-X1-Y1}N$ layer makes a second junction with the light emitting layer, and a misfit dislocation density at the first junction can be less than $1 \times 10^5$ $cm^{-1}$. In the structure including the two junctions, misfit dislocations can be reduced at the first junction.

In each aspect of the present invention, a c-axis direction in a semiconductor material for the $In_{X2}Al_{Y2}Ga_{1-X2-Y2}N$ layer and a magnitude of a lattice constant d2 thereof in the c-axis direction are represented by a lattice vector LVC2. The lattice vector LVC2 has a longitudinal component $V2_L$ in the direction of the normal axis and a transverse component $V2_T$ perpendicular to the longitudinal component. A lattice mismatch degree in the transverse direction to the c-axis ($V2_T-V0_T$)/$V0_T$ is not less than −0.5%, and the lattice mismatch degree can be not more than 0.2%. Introduction of misfit dislocations is reduced by the above range where the lattice mismatch between quaternary InAlGaN and GaN is kept small.

The $In_{X2}Al_{Y2}Ga_{1-X2-Y2}N$ layer providing this lattice mismatch degree can reduce the misfit dislocation density at the interface between the $In_{X2}Al_{Y2}Ga_{1-X2-Y2}N$ layer and the underlying layer because the lattice constant of $In_{X2}Al_{Y2}Ga_{1-X2-Y2}N$ is close to that of GaN.

In each aspect of the present invention, a direction of inclination of the semipolar primary surface is a direction from the c-axis of the hexagonal gallium nitride to one of an a-axis and an m-axis of the hexagonal gallium nitride; a direction of a first crystal axis of the hexagonal gallium nitride and a magnitude of a lattice constant d0N thereof in the direction of the first crystal axis are represented by a lattice vector LVN0 and the first crystal axis is another of the a-axis and the m-axis of the hexagonal gallium nitride; the lattice vector LVN0 has a longitudinal component $V0N_L$ in a direction of the normal axis and a transverse component $V0N_T$ perpendicular to the longitudinal component; a direction of a first crystal axis of the semiconductor material for the $In_{X2}Al_{Y2}Ga_{1-X2-Y2}N$ layer and a magnitude of a lattice constant d2N thereof in the direction of the first crystal axis are represented by a lattice vector LVN2, and the first crystal axis is another of the a-axis and the m-axis of a semiconductor material for the $In_{X2}Al_{Y2}Ga_{1-X2-Y2}N$ layer; the lattice vector LVN2 has a longitudinal component $V2N_L$ in the direction of the normal axis and a transverse component $V2N_T$ perpendicular to the longitudinal component; a lattice mismatch degree in a transverse direction ($V2N_T-V0N_T$)/$V0N_T$ is not less than −0.5%; and the lattice mismatch degree ($V2N_T-V0N_T$)/$V0N_T$ is not more than 0.2%.

In the $In_{X2}Al_{Y2}Ga_{1-X2-Y2}N$ layer providing this lattice mismatch degree, when the inclination direction of the semipolar primary surface is a direction to the one of the a-axis and the m-axis, the lattice constant of $In_{X2}Al_{Y2}Ga_{1-X2-Y2}N$ on the other of the a-axis and the m-axis is close to that of GaN, and therefore the misfit dislocation density can be reduced at the interface between the $In_{X2}Al_{Y2}Ga_{1-X2-Y2}N$ layer and the underlying layer. The introduction of misfit dislocations is reduced in the above range where the lattice mismatch between quaternary InAlGaN and GaN is kept small.

In each aspect of the present invention, the direction of inclination of the semipolar primary surface can be a direction from the c-axis of the hexagonal gallium nitride to the a-axis of the hexagonal gallium nitride. Alternatively, the direction of inclination of the semipolar primary surface can be a direction from the c-axis of the hexagonal gallium nitride to the m-axis of the hexagonal gallium nitride.

In each aspect of the present invention, a crystal axis direction perpendicular to the normal axis and the c-axis in the hexagonal gallium nitride, and a magnitude of a lattice constant d0N of the hexagonal gallium nitride in the crystal axis direction are represented by a lattice vector LVN0; the lattice vector LVN0 has a longitudinal component $V0N_L$ in a direction of the normal axis and a transverse component $V0N_T$ perpendicular to the longitudinal component; a crystal axis direction perpendicular to the normal axis and a c-axis of a semiconductor material for the $In_{X2}Al_{Y2}Ga_{1-X2-Y2}N$ layer and a magnitude of a lattice constant d2N thereof in the crystal axis direction are represented by a lattice vector LVN2; the lattice vector LVN2 has a longitudinal component $V2N_L$ in the direction of the normal axis and a transverse component $V2N_T$ perpendicular to the longitudinal component; a lattice mismatch degree in a transverse direction ($V2N_T-V0N_T$)/$V0N_T$ is not less than −0.5%; and the lattice mismatch degree ($V2N_T-V0N_T$)/$V0N_T$ is not more than 0.2%.

In the $In_{X2}Al_{Y2}Ga_{1-X2-Y2}N$ layer providing this lattice mismatch degree, the lattice constant of $In_{X2}Al_{Y2}Ga_{1-X2-Y2}N$ is close to that of GaN in the direction perpendicular to the inclination direction of the semipolar primary surface and therefore the misfit dislocation density can be reduced at the interface between the $In_{X2}Al_{Y2}Ga_{1-X2-Y2}N$ layer and the underlying layer. The introduction of misfit dislocations is reduced in the range where the lattice mismatch between quaternary InAlGaN and GaN is kept small.

Each aspect of the present invention may further comprise an $In_{X3}Al_{Y3}Ga_{1-X3-Y3}N$ (0<X3<1, 0<Y3<1, X3+Y3<1) layer provided between the p-type gallium nitride-based semiconductor layer and the light emitting layer. A thickness of the $In_{X3}Al_{Y3}Ga_{1-X3-Y3}N$ layer is not less than 300 nm, and the $In_{X3}Al_{Y3}Ga_{1-X3-Y3}N$ layer constitutes at least a part of a p-type cladding layer.

Using both the $In_{X1}Al_{Y1}Ga_{1-X1-Y1}N$ layer and the $In_{X3}Al_{Y3}Ga_{1-X3-Y3}N$ can reduce misfit dislocations at the interface of the p-type semiconductor layer and at the interface of the n-type semiconductor layer which are provided on both sides of the light emitting layer.

In each aspect of the present invention, a c-axis direction of a semiconductor material for the $In_{X3}Al_{Y3}Ga_{1-X3-Y3}N$ layer and a magnitude of a lattice constant d3 thereof in the c-axis direction are represented by a lattice vector LVC3; the lattice vector LVC3 has a longitudinal component $V3_L$ in a direction of the normal axis and a transverse component $V3_T$ perpendicular to the longitudinal component; a lattice mismatch degree in a transverse direction ($V3_T-V0_T$)/$V0_T$ is not less than −0.15%; and the lattice mismatch degree is not more than 0.2%.

In the $In_{X3}Al_{Y3}Ga_{1-X3-Y3}N$ layer providing this lattice mismatch degree, the lattice constant of $In_{X3}Al_{Y3}Ga_{1-X3-Y3}N$ is close to that of GaN and therefore the misfit dislocation density can be reduced at the interface between the $In_{X3}Al_{Y3}Ga_{1-X3-Y3}N$ layer and the underlying layer. When the lattice mismatch between quaternary InAlGaN and GaN is made small, the introduction of misfit dislocations is reduced thereat.

In each aspect of the present invention, the lattice mismatch degree ($V3_T-V0_T$)/$V0_T$ is not more than 0%; a direction of inclination of the semipolar primary surface is a direction from the c-axis of the hexagonal gallium nitride to one of an a-axis and an m-axis of the hexagonal gallium nitride; a direction of a first crystal axis and a magnitude of a lattice constant d0N of the hexagonal gallium nitride in the direction of the first crystal axis are represented by a lattice vector LVN0, and the first crystal axis is another of the a-axis and the m-axis of the hexagonal gallium nitride; a direction of a third crystal axis of the semiconductor material for the $In_{X3}Al_{Y3}Ga_{1-X3-Y3}N$ layer and a magnitude of a lattice constant d3N of the semiconductor material for the $In_{X3}Al_{Y3}Ga_{1-X3-Y3}N$ layer in the direction of the third crystal axis are represented by a lattice vector LVN3, and the third crystal axis is another of the a-axis and the m-axis of the semiconductor material for the $In_{X3}Al_{Y3}Ga_{1-X3-Y3}N$ layer; the lattice vector LVN0 has a longitudinal component $V0N_L$ in the direction of the normal axis and a transverse component $V0N_T$ perpendicular to the longitudinal component; the lattice vector LVN3 has a longitudinal component $V3N_L$ in the direction of the normal axis and a transverse component $V3N_T$ perpendicular to the longitudinal component; a lattice mismatch degree in the transverse direction $(V3N_T-V0N_T)/V0N_T$ is not less than 0%; and the lattice mismatch degree $(V3N_T-V0N_T)/V0N_T$ is not more than 0.2%.

In the $In_{x3}Al_{y3}Ga_{1-x3-y3}N$ layer providing this lattice mismatch degree, when the inclination direction of the semipolar primary surface is a direction to one of the a-axis and the m-axis, the lattice constant of $In_{x3}Al_{y3}Ga_{1-x3-y3}N$ on the other of the a-axis and the m-axis is close to that of GaN, and therefore the misfit dislocation density can be reduced at the interface between the $In_{x2}Al_{y2}Ga_{1-x2-y2}N$ layer and the underlying layer. The introduction of misfit dislocations is reduced in the range where the lattice mismatch between quaternary InAlGaN and GaN is kept small.

In each aspect of the present invention, a direction of inclination of the semipolar primary surface is a direction from the c-axis of the hexagonal gallium nitride to one of an a-axis and an m-axis of the hexagonal gallium nitride; a direction of a first crystal axis of the hexagonal gallium nitride and a magnitude of a lattice constant d0N thereof in the direction of the first crystal axis are represented by a lattice vector LVN0, and the first crystal axis is another of the a-axis and the m-axis of the hexagonal gallium nitride; a direction of a third crystal axis of the semiconductor material for the $In_{x3}Al_{y3}Ga_{1-x3-y3}N$ layer and a magnitude of a lattice constant d3N thereof in the direction of the third crystal axis are represented by a lattice vector LVN3, and the third crystal axis is another of the a-axis and the m-axis of the semiconductor material for the $In_{x3}Al_{y3}Ga_{1-x3-y3}N$ layer; the lattice vector LVN0 has a longitudinal component $V0N_L$, in the direction of the normal axis and a transverse component $V0N_T$ perpendicular to the longitudinal component; the lattice vector LVN3 has a longitudinal component $V3N_T$, in the direction of the normal axis and a transverse component $V3N_T$ perpendicular to the longitudinal component; a lattice mismatch degree in a transverse direction $(V3N_T-V0N_T)/V0N_T$ is not less than −0.15%; and the lattice mismatch degree $(V3N_T-V0N_T)/V0N_T$ is not more than 0.2%.

In the $In_{x3}Al_{y3}Ga_{1-x3-y3}N$ layer providing this lattice mismatch degree, when the inclination direction of the semipolar primary surface is a direction to one of the a-axis and the m-axis, the lattice constant of $In_{x3}Al_{y3}Ga_{1-x3-y3}N$ on the other of the a-axis and the m-axis is close to that of GaN, and therefore the misfit dislocation density can be reduced at the interface between the $In_{x3}Al_{y3}Ga_{1-x3-y3}N$ layer and the underlying layer. The introduction of misfit dislocations is reduced in the range where the lattice mismatch between quaternary InAlGaN and GaN is kept small.

In each aspect of the present invention, the direction of inclination of the semipolar primary surface can be a direction from the c-axis of the hexagonal gallium nitride to the a-axis of the hexagonal gallium nitride. Alternatively, the direction of inclination of the semipolar primary surface can be a direction from the c-axis of the hexagonal gallium nitride to the m-axis of the hexagonal gallium nitride.

In each aspect of the present invention, a c-axis direction of the hexagonal gallium nitride and a magnitude of a lattice constant d0 of the hexagonal gallium nitride in the c-axis direction are represented by a lattice vector LVC0; a c-axis direction of the semiconductor material for the $In_{x3}Al_{y3}Ga_{1-x3-y3}N$ layer and a magnitude of the lattice constant d3 thereof in the c-axis direction are represented by the lattice vector LVC3; the lattice vector LVC0 has a longitudinal component $V0_L$ in the direction of the normal axis and a transverse component $V0_T$ perpendicular to the longitudinal component; the lattice vector LVC3 has the longitudinal component $V3_L$ in the direction of the normal axis and the transverse component $V3_T$ perpendicular to the longitudinal component; a lattice mismatch degree in a transverse direction $(V3_T-V0_T)/V0_T$ is not less than −0.15%; the lattice mismatch degree $(V3_T-V0_T)/V0_T$ is not more than 0%; a direction of a crystal axis perpendicular to the normal axis and the c-axis of the hexagonal gallium nitride, and a magnitude of a lattice constant d0N of the hexagonal gallium nitride in the direction of the crystal axis are represented by a lattice vector LVN0; a direction of a crystal axis perpendicular to the normal axis and the c-axis of the semiconductor material for the $In_{x3}Al_{y3}Ga_{1-x3-y3}N$ layer, and a magnitude of a lattice constant d3N thereof in the direction of the crystal axis are represented by a lattice vector LVN3; the lattice vector LVN0 has a longitudinal component $V0N_T$, in the direction of the normal axis and a transverse component $V0N_T$ perpendicular to the longitudinal component; the lattice vector LVN3 has a longitudinal component $V3N_L$, in the direction of the normal axis and a transverse component $V3N_T$ perpendicular to the longitudinal component; a lattice mismatch degree in the transverse direction $(V3N_T-V0N_T)/V0N_T$ is not less than 0%; and the lattice mismatch degree $(V3N_T-V0N_T)/V0N_T$ is not more than 0.2%.

In the $In_{x3}Al_{y3}Ga_{1-x3-y3}N$ layer, the lattice match condition in the direction parallel to the inclination direction of the semipolar primary surface and the lattice match condition in a direction perpendicular to the off direction are different from each other. The ranges of the foregoing lattice mismatch degree can provide the device with excellent device characteristics.

In each aspect of the present invention, the light emitting layer comprises an active layer and an optical guide layer; the optical guide layer is provided between the $In_{x1}Al_{y1}Ga_{1-x1-y1}N$ layer and the active layer; and the active layer includes the quantum well structure. This structure of the light emitting layer is useful for a semiconductor laser.

In each aspect of the present invention, the optical guide layer may include an InGaN layer, and an In composition of the InGaN layer can be not less than 0.02 and not more than 0.06.

In the device which includes the n-side cladding layer comprising AlGaN, the luminous efficiency is significantly reduced with increase in the In composition of the InGaN guide layer. It is conceivably because the lattice mismatch between the cladding layer and the optical guide layer is large. When the optical guide layer comprises material having a large In composition, using the cladding layer of InAlGaN is effective in avoiding reduction in the luminous efficiency. Use of the optical guide layer having the high In composition can enhance the refractive index of the optical guide layer, thereby improving optical confinement.

In each aspect of the present invention, a misfit dislocation density at an interface between the InGaN layer of the optical guide layer and a semiconductor layer which is located between the support base and the InGaN layer of the optical guide layer is not more than $1 \times 10^5$ cm$^{-1}$. In the device where the n-side cladding layer comprises AlGaN, when the In composition of the optical guide layer is increased in order to improve optical confinement, dislocations are introduced over the foregoing range, so as to decrease the luminous efficiency.

In each aspect of the present invention, a misfit dislocation density at an interface between the InGaN layer of the optical guide layer and a semiconductor layer located between the support base and the InGaN layer of the optical guide layer is not less than $5 \times 10^3$ cm$^{-1}$. The optical guide layer which is slightly relaxed to reduce strain in the well layers can prevent defects from occurring at the interfaces between the well layers and the barrier layers even if the well layers have a high In composition enabling green emission.

In each aspect of the present invention, the light emitting layer further comprises another optical guide layer, and the other optical guide layer can be provided between the $In_{X2}Al_{Y2}Ga_{1-X2-Y2}N$ layer and the active layer. This structure of the light emitting layer is useful for a semiconductor laser.

In each aspect of the present invention, the other optical guide layer includes an InGaN layer, and an In composition of the InGaN layer can be not less than 0.02 and not more than 0.06.

In the device that includes the n-side or p-side cladding layer comprising AlGaN, the luminous efficiency is significantly reduced with increase in the In composition of the InGaN guide layer. It is conceivably because the lattice mismatch between the cladding layer and the optical guide layer is large. When the optical guide layer comprises material having a large In composition, using the cladding layer of InAlGaN is effective in avoiding reduction in the luminous efficiency. Use of the optical guide layer having the high In composition can enhance the refractive index of the optical guide layer, thereby improving optical confinement.

In each aspect of the present invention, the light emitting layer is provided so as to emit light in a wavelength range of not less than 400 nm and not more than 550 nm. The occurrence of misfit dislocations due to slip of c-plane plane is attributed to inclination of the c-plane resulting from the semipolar plane. In the foregoing wavelength range, when the lattice mismatch between quaternary InAlGaN and GaN os made small, the reduction in luminous efficiency can be avoided in the range of wavelength of visible light.

In each aspect of the present invention, an angle of inclination of the semipolar primary surface can be in the range of not less than 10 degrees and not more than 80 degrees or in the range of not less than 100 degrees and not more than 170 degrees. Strained AlGaN in these angular ranges behaves differently from strained AlGaN on the c-plane GaN substrate and therefore quaternary InAlGaN is useful therefor.

In each aspect of the present invention, an angle of inclination of the semipolar primary surface can be in the range of not less than 63 degrees and not more than 80 degrees or in the range of not less than 100 degrees and not more than 117 degrees. The influence of the piezoelectric field can be reduced in these angular ranges. The misfit dislocations due to the c-plane slip plane are likely to occur in the foregoing angular ranges. Accordingly, quaternary InAlGaN is useful therefor.

The above objects and the other objects, features, and advantages of the present invention will more readily become clear in view of the following detailed description of the preferred embodiments of the present invention proceeding with reference to the accompanying drawings.

Effect of the Invention

As described above, one aspect of the present invention provides the nitride semiconductor light emitting device that includes the light emitting layer above the GaN support base with the semipolar plane and allows for suppression of the reduction in luminous efficiency due to misfit dislocations. Another aspect of the present invention provides the epitaxial substrate for the nitride semiconductor light emitting device. Furthermore, still another aspect of the present invention provides the method for fabricating the nitride semiconductor light emitting device.

MODES FOR CARRYING OUT THE INVENTION

The expertise of the present invention can be readily understood in view of the following detailed description with reference to the accompanying drawings provided by way of illustration only. Embodiments of the nitride semiconductor light emitting device and the epitaxial substrate, and the method for fabricating the epitaxial substrate and the nitride semiconductor light emitting device according to the present invention will be described below with reference to the accompanying drawings. The same portions will be denoted by the same reference symbols as much as possible. The description herein about crystal axes of a1 axis, a2 axis, a3 axis and c-axis of a hexagonal crystal (the c-axis is perpendicular to the a1 axis, a2 axis and a3 axis) follows the following notation for directions opposite to positive directions of the respective crystal axes: for example, [000-1] axis is opposite to [0001] axis and for indicating an opposite direction, a numeral (e.g., "1") is given a minus sign in front thereof, "-1."

Figure 1:
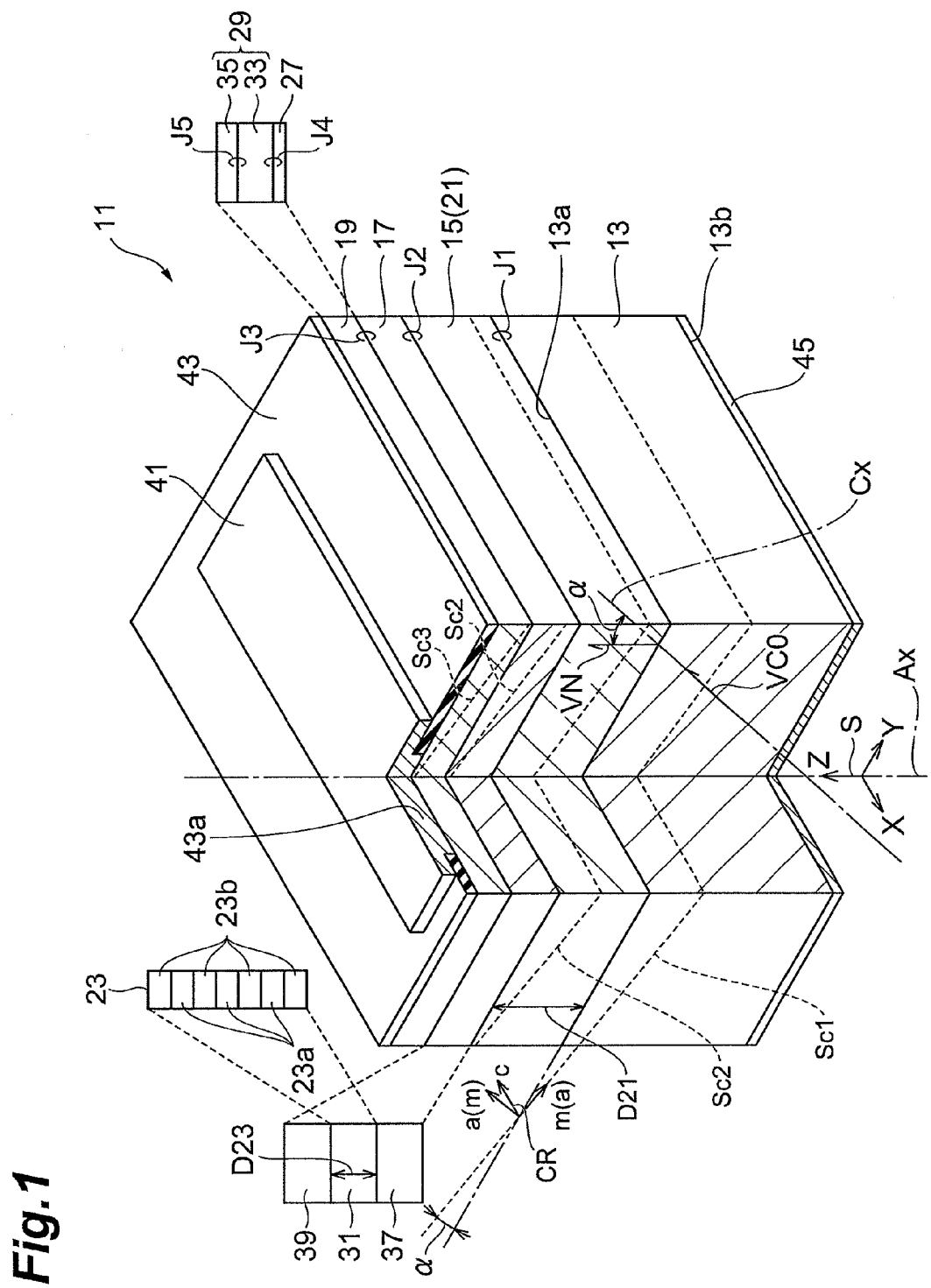
FIG. 1 is a drawing schematically showing a nitride semiconductor light emitting device according to an embodiment of the present invention.

FIG. 1 is a drawing schematically showing a nitride semiconductor light emitting device according to the present embodiment. FIG. 1 shows a crystal coordinate system CR (c-axis, a-axis, and m-axis) and an orthogonal coordinate system S. The nitride semiconductor light emitting device 11 has a support base 13, an n-type gallium nitride (GaN)-based semiconductor layer 15, a light emitting layer 17, and a p-type GaN-based semiconductor layer 19. The support base 13 comprises hexagonal GaN and has a primary surface 13a and a back surface 13b. The primary surface 13a can be a semipolar plane inclined with respect to a plane perpendicular to the c-axis of the hexagonal GaN. With reference to FIG. 1, a typical c-plane Sc1 is shown, the c-plane Sc1 is perpendicular to a c-axis vector VC0, and the vector VC0 is directed along either of the <0001> axis and <000-1> axis. The crystal coordinate system CR is depicted in association with the c-plane Sc 1 and the c-axis vector VC0. The back surface 13b can also be semipolar. The n-type GaN-based semiconductor layer 15 and the light emitting layer 17 are provided on the support base 13. The light emitting layer 17 comprises a GaN-based semiconductor, and this GaN-based semiconductor encompasses, for example, of GaN, InGaN, or the like. The light emitting layer 17 has a quantum well structure 23, which can includes InGaN layers. The quantum well structure 23 includes well layers 23a and barrier layers 23b arranged alternately, the well layers 23a comprises, for example, InGaN layers or the like, and the barrier layers 23b comprises, for example, layers of GaN, InGaN, or the like. The light emitting layer 17 is provided between the n-type GaN-based semiconductor layer 15 and the p-type GaN-based semiconductor layer 19. A normal vector VN normal to the semipolar primary surface 13a of the substrate 13 is defined by angle α with respect to a reference axis Cx.

The light emitting layer 17 can be provided, for example, so as to emit light in the wavelength range of not less than 400 nm and not more than 550 nm. Occurrence of misfit dislocations due to the c-plane slip is attributed to inclination of the c-plane resulting from the semipolar plane. With the foregoing wavelength range, reduction in luminous efficiency is avoided in the wavelength range of visible light by keeping the lattice mismatch small between quaternary InAlGaN and GaN.

The n-type GaN-based semiconductor layer 15 can include an $In_{X1}Al_{Y1}Ga_{1-X1-Y1}N$ (0<X1<1, 0<Y1<1, 0<X1+Y1<1) layer 21. The $In_{X1}Al_{Y1}Ga_{1-X1-Y1}N$ (hereinafter referred to simply as "InAlGaN") layer 21 is provided between the light emitting layer 17 and the semipolar primary surface 13a of the support base 13. The InAlGaN is doped with an n-type dopant, and the n-type dopant applicable herein is, for example, Si, Ge, or the like. The support base 13, InAlGaN layer 21, light emitting layer 17 and p-type GaN-based semiconductor layer 19 are arranged in order along a normal axis Ax normal to the semipolar plane 13a, and the normal axis Ax extends along a direction of the Z-axis of the orthogonal coordinate system S. The thickness D21 of the InAlGaN layer 21 is larger than the thickness D23 of the quantum well structure 23. The bandgap E(InAlGaN) of the InAlGaN layer 21 is not less than the bandgap E(GaN) of hexagonal GaN, and the bandgap E(InAlGaN) can be larger than the bandgap E(GaN). A c-plane Sc2 of the InAlGaN layer 21 is inclined relative to the normal axis Ax.

This nitride semiconductor light emitting device 11 is provided with the InAlGaN layer 21 between the support base 13 and the InGaN layer of the light emitting layer 17. The bandgap E(InAlGaN) of the InAlGaN layer 21 is not less than the bandgap E(GaN) of GaN, thereby providing a confinement effect of carriers and light in the light emitting layer 17.

Although the c-plane Sc2 of the InAlGaN layer 21 is inclined with respect to the normal axis Ax, the density of misfit dislocations due to the slip plane primarily composed of the c-plane is reduced, as compared to AlGaN, by adjustment of lattice constants based on a group III composition of the quaternary InAlGaN layer.

Since the InAlGaN layer 21 is thicker than the quantum well structure 23 in thickness, misfit dislocations become more likely to occur with AlGaN having the bandgap comparable to that of the InAlGaN layer 21. The thickness D21 can be, for example, not less than 300 nm. The thickness D21 can be not more than 3 μm. When the nitride semiconductor light emitting device 11 includes a semiconductor laser, the InAlGaN layer 21 can constitute at least a part of the n-type cladding layer. A cladding layer useful for optical confinement can be constructed in the foregoing thickness range.

The InAlGaN layer 21 makes a first junction J1 with the support base 13. The InAlGaN layer 21 makes a second junction J2 with the light emitting layer 17. The misfit dislocation density at the first junction J1 can be less than $1 \times 10^5$ $cm^{-1}$. The misfit dislocation density can be made smaller by the structure including the two junctions J1 and J2.

The inclination angle α between the normal axis Ax of the semipolar primary surface 13a and the c-axis vector VC0 can be in the range of not less than 10 degrees and not more than 80 degrees or in the range of not less than 100 degrees and not more than 170 degrees. In these angular ranges, AlGaN on a semipolar plane behaves differently from strained AlGaN on a c-plane GaN substrate. The c-plane of AlGaN on the semipolar plane is inclined with respect to the surface of the underlying semiconductor layer, and the inclined c-plane reaches the surface of the underlying semiconductor layer. Accordingly, misfit dislocations due to the slip plane primarily made of the c-plane are introduced to AlGaN on the semipolar plane to induce lattice relaxation of AlGaN on the semipolar plane. For this reason, quaternary InAlGaN which can reduce internal strain is applicable to epitaxial growth of the GaN-based semiconductor in these angular ranges on the underlying layer. For example, quaternary InAlGaN can provide the lattice constant d(InAlGaN) which is closer to the lattice constant d(GaN) of GaN than the lattice constant d(AlGaN) of AlGaN with the same bandgap as the InAlGaN. The quaternary InAlGaN can also provide the lattice constant d(InAlGaN) which is closer to the lattice constant d(GaN) of GaN than the lattice constant d(AlGaN) of AlGaN with the same refractive index as the InAlGaN.

Specifically, a lattice vector LVC0 represents a c-axis direction in GaN of the support base 13 and a magnitude of a lattice constant d0 thereof in the c-axis direction, and a lattice vector LVC1 represents a c-axis direction of a semiconductor material (unstained) for the InAlGaN layer 21 and a magnitude of a lattice constant d1 thereof in the c-axis direction. The lattice vector LVC0 includes a longitudinal component $V0_L$ along the normal axis Ax and a transverse component $V0_T$ perpendicular to the longitudinal component, and the lattice vector LVC1 includes a longitudinal component $V1_L$ along the normal axis Ax and a transverse component $V1_T$ perpendicular to the longitudinal component. These vectors are expressed by (longitudinal component, transverse component) as follows:

$$LVC0 = (V0_L, V0_T);$$

$$LVC1 = (V1_L, V1_T).$$

According to this notation, a lattice mismatch degree F21 in the transverse direction is defined as follows:

$$F21 = (V1_T - V0_T)/V0_T.$$

The lattice mismatch degree F21 in the InAlGaN layer 21 can be not less than −0.15%. The lattice mismatch degree F21 can also be not more than 0.2%. The InAlGaN layer 21 providing the lattice mismatch degree F21 in the above range can reduced the misfit dislocation density at the interface between the InAlGaN layer 21 and the underlying layer because the lattice constant of InAlGaN in this composition is close to that of GaN. Introduction of misfit dislocations can be reduced by keeping the lattice mismatch small between quaternary InAlGaN and GaN.

Figure 2:
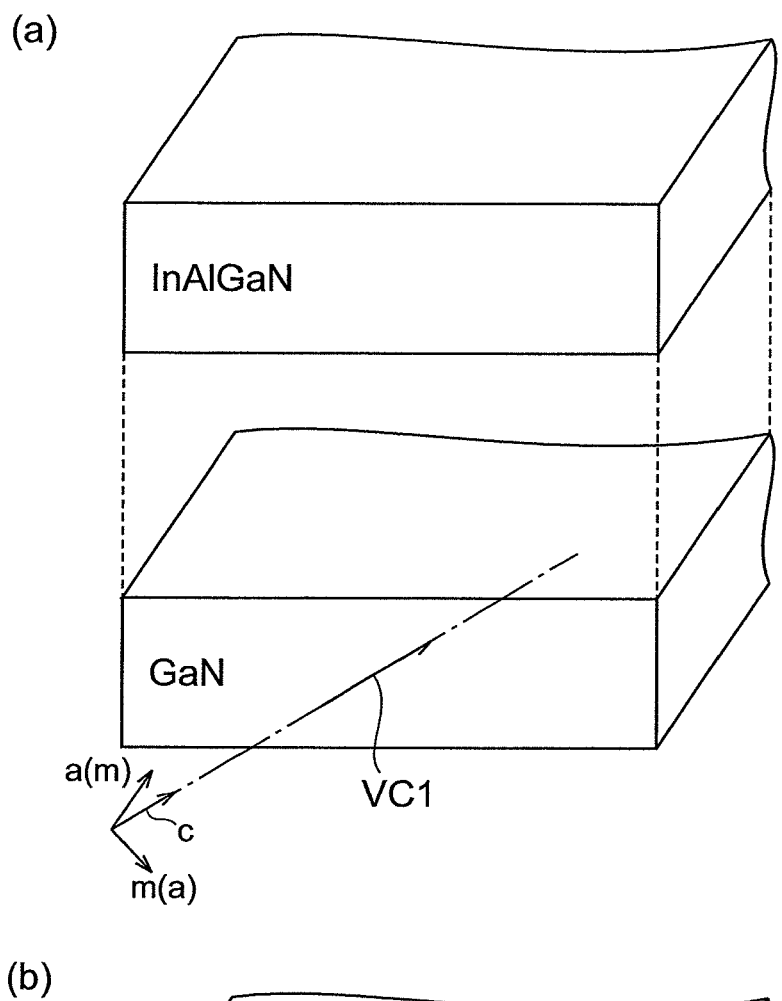
FIG. 2 is a drawing showing a relation of lattice constants in the direction of inclination of the c-axis between GaN and InAlGaN which is to be epitaxially grown on the GaN.
Figure 2:
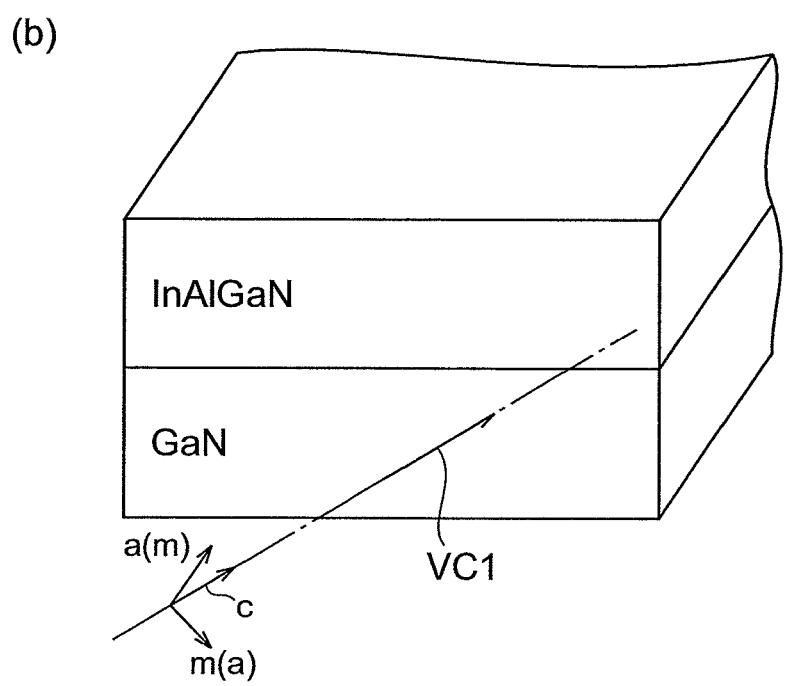

InAlGaN is mixed crystals of GaN, InN, and AlN. In the crystals of GaN, InN, and AlN, their respective ratios of a-axis lattice constant to c-axis lattice constant are not the same. For this reason, when InAlGaN is grown on a semipolar primary surface of GaN, lattice matches in two orthogonal directions cannot be simultaneously achieved at the interface between GaN and InAlGaN. FIG. 2 is a drawing showing a relation of lattice constants in the inclination direction of the c-axis in GaN and InAlGaN which is to be epitaxially grown on this GaN. The InAlGaN shown in part (a) of FIG. 2 is in a strain-free state and, therefore, the lattice constants on the c-axis, the a-axis, and the m-axis of InAlGaN are intrinsic to InAlGaN defined by an In composition and an Al composition of the strain-free InAlGaN. Referring to part (a) of FIG. 2, a c-axis vector VC1 of GaN is shown, and the c-axis of GaN is inclined toward the m-axis as indicated by the vector VC1. The c-plane of GaN is inclined in the inclination direction relative to the primary surface of GaN. When InAlGaN is epitaxially grown directly on the GaN or on a semiconductor strained in accordance with the lattice constant of GaN as shown in part (b) of FIG. 2, the lattice mismatch between the GaN and InAlGaN in the inclination direction of the c-axis can be within the following range using the previously-described lattice mismatch degree F21 "$(V1_T − V0_T)/V0_T$":

$$-0.15\% \leq F21 \leq 0.2\%.$$

By use of the InAlGaN layer 21 providing the lattice mismatch degree F21 in this range, the lattice constant of InAlGaN in this composition is close to that of GaN and introduction of misfit dislocations is reduced by keeping the lattice mismatch small between quaternary InAlGaN and GaN. When the lattice mismatch is set in the above range to achieve the lattice match on the axis defined as the projected c-axis, the lattice constant of InAlGaN in a direction perpendicular to the direction of inclination of the c-axis becomes greater than that of GaN (the lattice constant in the direction perpendicular to the inclination direction).

When the c-axis of GaN is inclined toward the a-axis, the same lattice mismatch degree can be defined and in this case, the lattice mismatch degree F21 "$(V1_T − V0_T)/V0_T$" can also be used and can be in the following range:

$$-0.15\% \leq F21 \leq 0.2\%.$$

When the direction of inclination of the semipolar primary surface is a direction from the c-axis to the m-axis of GaN, the lattice mismatch degree can be defined in the direction of the a-axis. The direction of the a-axis in GaN and a magnitude of a lattice constant d0N of GaN in the a-axis direction are represented by a lattice vector LVN0. This lattice vector LVN0 includes a longitudinal component $V0N_L$ in the direction of the normal axis Ax and a transverse component $V0N_T$ perpendicular to the longitudinal component. A direction of the a-axis of a semiconductor material for the InAlGaN (i.e., $In_{X1}Al_{Y1}Ga_{1-X1-Y1}N$) layer and a magnitude of a lattice constant d1N of the semiconductor material for the InAlGaN in the a-axis direction are represented by a lattice vector LVN1. The lattice vector LVN1 includes a longitudinal component $V1N_L$ in the direction of the normal axis Ax and a transverse component $V1N_T$ perpendicular to the longitudinal component. These vectors are expressed by (longitudinal component, transverse component) as follows:

$$LVN0 = (V0N_L, V0N_T);$$

$$LVN1 = (V1N_L, V1N_T).$$

According to this notation, the lattice mismatch degree F21N in the transverse direction is defined as follows:

$$F21N = (V1N_T − V0N_T)/V0N_T.$$

Figure 3:
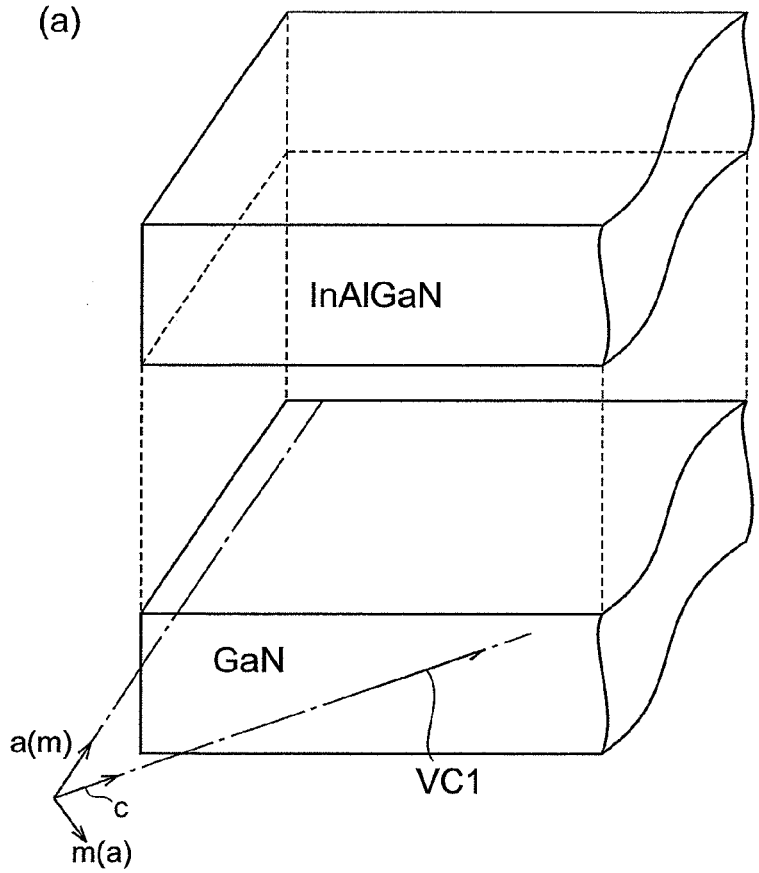
FIG. 3 is a drawing showing a relation of lattice constants in a direction perpendicular to the direction of inclination of the c-axis in GaN and InAlGaN which is to be epitaxially grown on the GaN.
Figure 3:
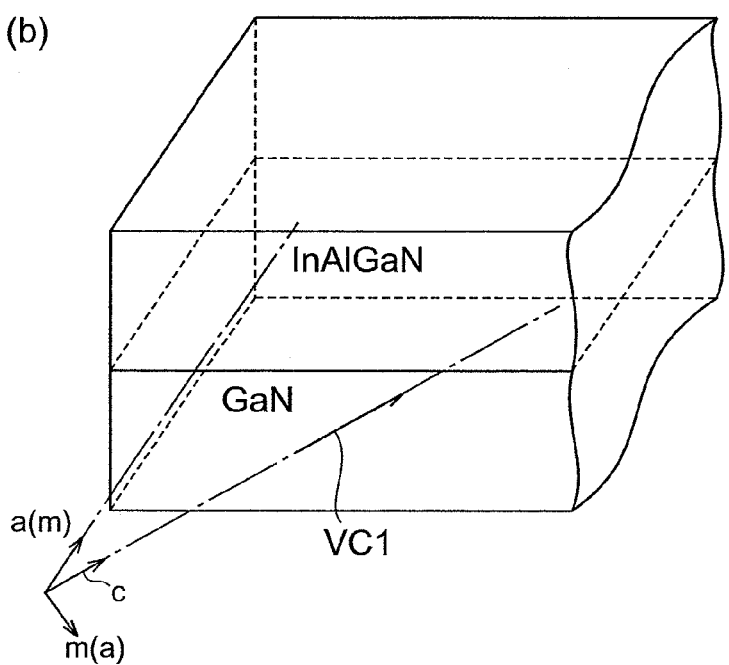

With reference to part (a) of FIG. 3, the c-axis vector VC1 of GaN is shown and the c-axis of GaN is inclined toward the m-axis as indicated by the vector VC1. In the direction of this inclination, the c-plane of GaN is inclined with respect to the primary surface of GaN. When InAlGaN is epitaxially grown on this GaN as shown in FIG. 3(b), the lattice mismatch between this GaN and InAlGaN in the direction of the a-axis can be within the following range using the previously-described lattice mismatch degree F21N "$(V1N_T − V0N_T)/V0N_T$":

$$-0.15\% \leq F21N \leq 0.2\%.$$

By use of the InAlGaN layer 21 providing the lattice mismatch degree F21N in this range, the lattice constant of InAlGaN in this composition is close to that of GaN and the misfit dislocation density can be reduced at the interface between the $In_{X1}Al_{Y1}Ga_{1-X1-Y1}N$ layer and the underlying layer. Introduction of misfit dislocations is reduced in the range where the lattice mismatch between quaternary InAlGaN and GaN is kept small.

According to the inventors' knowledge, the lattice relaxation is less likely to occur in the direction perpendicular to the inclination direction of the semipolar primary surface. However, occurrence of lattice relaxation in the perpendicular direction leads to generation of threading dislocations in the epitaxially grown $In_{X1}Al_{Y1}Ga_{1-X1-Y1}N$ layer. The generation of the dislocations adversely affects device characteristics. The lattice match condition in the direction parallel to the inclination direction of the semipolar primary surface and the lattice match condition perpendicular thereto are different as illustrated, in InAlGaN with a relatively high Al composition. Therefore, this condition is more suitable for high Al compositions of InAlGaN.

When the c-axis of GaN is inclined toward the a-axis, the same lattice mismatch degree can also be defined and in this case, it can be in the following range using the lattice mismatch degree F21N "$(V1N_T − V0N_T)/V0N_T$":

$$-0.15\% \leq F21N \leq 0.2\%.$$

When the lattice mismatch is set in the above range to achieve a lattice match between lattice constants in a direction perpendicular to the inclination direction of the c-axis (e.g., lattice constants on the a-axis), the lattice constant of InAlGaN in the inclination direction of the c-axis becomes smaller than that of GaN (lattice constant in the inclination direction of the c-axis).

When a small off angle in the direction of inclination of the c-axis with respect to the m-axis is substantially zero and the inclination direction of the c-axis is inclined toward the m-axis, the lattice mismatch degree F21N perpendicular to the inclination direction can be defined using transverse components in a direction perpendicular to both of the c-axis and the normal axis.

Since in crystals of GaN, InN and AlN, their respective ratios of a-axis lattice constant to c-axis lattice constant are not the same, InAlGaN does not allow simultaneous achievements of lattice matches in two orthogonal directions at the interface between InAlGaN and GaN or a semiconductor strained in accordance with the lattice constant of GaN. According to the inventors' knowledge, however, there are lattice mismatch ranges that can be realized in two orthogonal directions.

Figure 4:
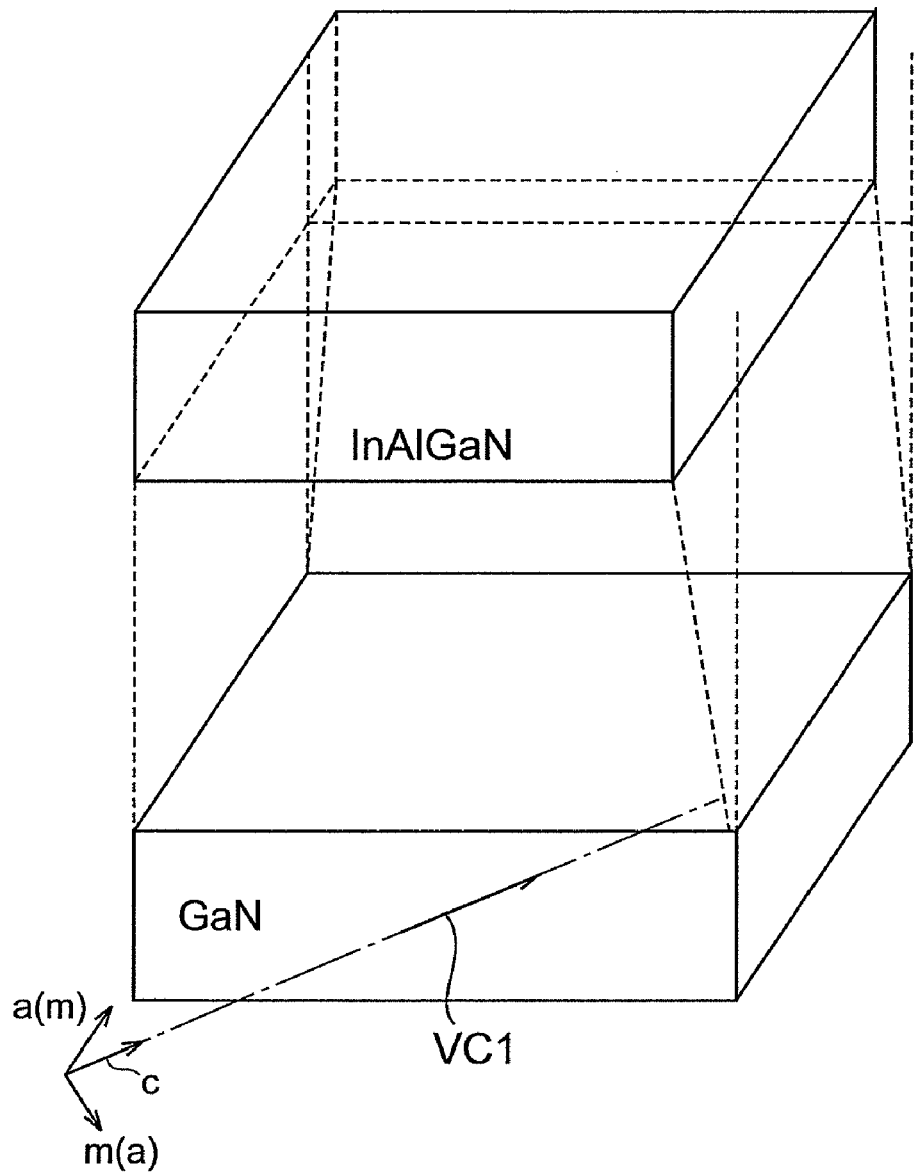
FIG. 4 is a drawing showing a relation of lattice constants in the direction of inclination of the c-axis and in a direction perpendicular thereto between GaN and InAlGaN which is to be epitaxially grown on the GaN.

When InAlGaN is epitaxially grown on this GaN (or on a semiconductor strained in accordance with the lattice constant of GaN) as shown in FIG. 4, the lattice mismatch between this GaN and InAlGaN in the inclination direction of the c-axis can be in the following range using the previously described lattice mismatch degree F21 "$(V1_T - V0_T)/V0_T$":

$$-0.15\% \leq F21 \leq 0\%.$$

The lattice mismatch between this GaN and InAlGaN in the inclination direction of the a-axis can be in the following range using the previously described lattice mismatch degree F21N "$(V1N_T - V0N_T)/V0N_T$":

$$0\% \leq F21N \leq 0.2\%.$$

However, F21 and F21N are not zero at the same time. The relations of the lattice mismatch degrees F21 and F21N show the following: the lattice constant of InAlGaN in the inclination direction of the c-axis is smaller than that of GaN in the same direction; the lattice constant of InAlGaN in the direction perpendicular to the inclination direction of the c-axis is larger than that of GaN in the same direction.

The In composition X1 of the $In_{X1}Al_{Y1}Ga_{1-X1-Y1}N$ layer 21 can be not less than 0.01. This In composition X1 can be not more than 0.06. In this composition range, the lattice constants of InAlGaN can be made closer to those of GaN, and this In composition range is useful for providing InAlGaN with the bandgap for the cladding layer.

The Al composition Y1 of the $In_{X1}Al_{Y1}Ga_{1-X1-Y1}N$ layer can be not less than 0.05. This Al composition Y1 can be not more than 0.30. This Al composition range is useful for providing InAlGaN with the bandgap for the cladding layer.

Furthermore, the bandgap energy E21 of the InAlGaN layer 21 can be not less than 3.51 electron volts (eV) (1 eV is equivalent to $1.602 \times 10^{19}$ J). This bandgap energy E21 can be not more than 3.63 eV. This bandgap energy range allows the lattice constant of quaternary InAlGaN to be made closer to that of GaN and allows the InAlGaN layer 21 to be provided with the refractive index for cladding.

The light emitting layer 17 can include an active layer 31 and optical guide layers 37, 39. The optical guide layer 37 is provided between the electron block layer 21 and the active layer 31. The optical guide layer 39 is provided between an InAlGaN layer 27 and the active layer 31. This structure of the light emitting layer 17 is useful for a semiconductor laser. The optical guide layers 37, 39 can comprise, for example, undoped InGaN, GaN, or the like.

The optical guide layers 37, 39 can include an InGaN layer. If the In composition of the InGaN guide layer is increased in a device with the cladding layer of AlGaN, the luminous efficiency will decrease significantly. It is conceivably because the lattice mismatch between the cladding layer and the guide layer is large. When the optical guide layer is made of a material with a large In composition, the luminous efficiency can be maintained by using the cladding layer of InAlGaN. The In composition of the InGaN layer of the optical guide layer 37 can be not less than 0.02 and not more than 0.06. The In composition of the InGaN layer of the optical guide layer 39 can also be not less than 0.02 and not more than 0.06. Use of the optical guide layers with the high In composition can enhance the refractive index of the optical guide layers, which improves optical confinement.

The misfit dislocation density at the interface between the InGaN layer of the optical guide layer 37 and the semiconductor layer, which is located between the InGaN layer of the optical guide layer 37 and the support base 13, can be not more than $1 \times 10^5$ cm$^{-1}$. If the In composition of the optical guide layer 37 is increased for improvement in optical confinement in a device with the n-side cladding layer of AlGaN, dislocations will be introduced over the aforementioned range, so as to decrease the luminous efficiency.

The misfit dislocation density at the interface between the InGaN layer of the optical guide layer 37 and the semiconductor layer, which is located between the InGaN layer of the optical guide layer 39 and the support base 13, can be not less than $5 \times 10^3$ cm$^{-1}$. The optical guide layer 39 slightly relaxed to reduce strain in the well layers can prevent defects from occurring at the interfaces between the well layers and the barrier layers, even with the well layers having a high In composition enabling green emission.

The p-type GaN-based semiconductor layer 19 can include, for example, an electron block layer 27 and a p-type GaN-based semiconductor layer 29. The c-plane in each of these semiconductor layers 27, 29 is inclined relative to the normal axis Ax as in the InAlGaN layer 21. The electron block layer 27 can comprise, for example, AlGaN, InAlGaN, or the like. The p-type GaN-based semiconductor layer 29 can comprise, for example, AlGaN, InAlGaN, GaN, or the like. Furthermore, the p-type GaN-based semiconductor layer 29 can include a p-type GaN-based semiconductor cladding layer 33 and a p-type GaN-based semiconductor contact layer 35. The p-type GaN-based semiconductor cladding layer 33 can comprise, for example, AlGaN, InAlGaN, or the like. The p-type GaN-based semiconductor contact layer 35 can comprise, for example, AlGaN, InAlGaN, GaN, or the like. In addition, an optical guide layer may be further included between the electron block layer 27 and the p-type GaN-based semiconductor cladding layer 33.

When the electron block layer 27 comprise quaternary $In_{X2}Al_{Y2}Ga_{1-X2-Y2}N$ (0<X2<1, 0<Y2<1, 0<X2+Y2<1), a typical c-plane Sc3 of this $In_{X2}Al_{Y2}Ga_{1-X2-Y2}N$ layer (hereinafter referred to as "InAlGaN layer") 27 is inclined relative to the normal axis Ax as the c-plane Sc 1 is. At a junction J3 between the InAlGaN layer 27 and the light emitting layer 17, misfit dislocations are reduced.

Misfit dislocations are introduced in AlGaN on a semipolar plane by a slip plane primarily of the c-plane, to induce lattice relaxation of AlGaN on the semipolar plane. For this reason, quaternary InAlGaN capable of reducing internal strain is applicable to epitaxial growth on the underlying layer of the light emitting layer having a semipolar primary surface in these angular ranges. For example, quaternary InAlGaN can provide the lattice constant d(InAlGaN) closer to the lattice constant d(GaN) of GaN than the lattice constant d(AlGaN) of AlGaN with the same bandgap as that of the InAlGaN. The quaternary InAlGaN can also provide the lattice constant d(InAlGaN) closer to the lattice constant d(GaN) of GaN than the lattice constant d(AlGaN) of AlGaN with the same refractive index as that of this InAlGaN.

Specifically, a lattice vector LVC2 represents a c-axis direction of a semiconductor material (unstrained) for the InAlGaN layer 27 and a magnitude of a lattice constant d2 thereof in the c-axis direction. This lattice vector LVC2 includes a longitudinal component $V2_L$ in the direction of the normal axis Ax and a transverse component $V2_T$ perpendicular to the longitudinal component. The vector can be expressed by (longitudinal component, transverse component) as follows:

$LVC2=(V2_L, V2_T)$.

According to this notation, a lattice mismatch degree F27 in the transverse direction to the c-axis is defined as follows:

$$F27=(V2_T-V0_T)/V0_T.$$

In this case, $LVC0=(V0_L, V0_T)$. The lattice mismatch degree F27 in the InAlGaN layer 27 can be not less than −0.5%. The lattice mismatch degree F27 can also be not more than 0.2%. With the InAlGaN layer 27 providing the lattice mismatch degree F27 in this range, the lattice constant of InAlGaN in this composition is close to that of GaN, and therefore the misfit dislocation density can be reduced at the interface between the InAlGaN layer 27 and the underlying light emitting layer 17. Introduction of misfit dislocations is reduced by keeping the lattice mismatch small between quaternary InAlGaN and GaN.

When the c-axis of GaN is inclined toward the m-axis, the c-plane of GaN is inclined in the inclination direction relative to the primary surface of GaN. When InAlGaN is epitaxially grown directly on this GaN or on a semiconductor strained in accordance with the lattice constant of GaN, the lattice mismatch between this GaN and InAlGaN in the inclination direction of the c-axis can be in the following range using the previously described lattice mismatch degree $$F27\text{``}F27 = (V2_T - V0_T)/V0_T\text{''}: \quad -0.5\% \leq F27 \leq 0.2\%.$$

With the InAlGaN layer 27 providing the lattice mismatch degree F27 in this range, the lattice constant of InAlGaN in this composition is close to that of GaN and introduction of misfit dislocations is reduced by keeping the lattice mismatch small between quaternary InAlGaN and GaN. When the lattice mismatch is set in the foregoing range to implement a lattice match on the projected axis of the c-axis, the lattice constant of InAlGaN in the direction perpendicular to the inclination direction of the c-axis becomes larger than the lattice constant of GaN (lattice constant in the direction perpendicular to the inclination direction).

When the c-axis of GaN is inclined toward the a-axis, the same lattice mismatch degree can also be defined, and in this case, the lattice mismatch degree F27 "$(V2_T-V0_T)/V0_T$" can also be used and can be in the following range:

$$-0.5\% \leq F27 \leq 0.2\%.$$

When the inclination direction of the semipolar primary surface is a direction from the c-axis to the m-axis of GaN, the lattice mismatch degree in the direction of the a-axis can be defined. The direction of the a-axis in GaN and a magnitude of a lattice constant d0N thereof in the a-axis direction are represented by a lattice vector LVN0. This lattice vector LVN0 includes a longitudinal component $V0N_L$ in the direction of the normal axis Ax and a transverse component $V0N_T$ perpendicular to the longitudinal component. A direction of the a-axis of a semiconductor material for the InAlGaN layer (i.e., $In_{X2}Al_{Y2}Ga_{1-X2-Y2}N$ layer 27) and a magnitude of a lattice constant d2N in the a-axis direction are represented by a lattice vector LVN2. The lattice vector LVN2 includes a longitudinal component $V2N_L$ in the direction of the normal axis Ax and a transverse component $V2N_T$ perpendicular to the longitudinal component. These vectors are expressed by (longitudinal component, transverse component) as follows:

$LVN0=(V0N_L, V0N_T)$;

$LVN2=(V2N_L, V2N_T)$.

According to this notation, the lattice mismatch degree F27N in the transverse direction is defined as follows:

$$F27N=(V2N_T-V0N_T)/V0N_T.$$

When InAlGaN is epitaxially grown on GaN, the lattice mismatch between this GaN and InAlGaN in the direction of the a-axis can be within the following range using the previously-described lattice mismatch degree F27N "$(V2N_T-V0N_T)/V0N_T$":

$$-0.5\% \leq F27N \leq 0.2\%.$$

With the InAlGaN layer 27 providing the lattice mismatch degree F27N in this range, the lattice constant of InAlGaN in this composition is close to that of GaN, and the misfit dislocation density can be reduced at the interface between the $In_{X2}Al_{Y2}Ga_{1-X2-Y2}N$ layer 27 and the underlying layer. Introduction of misfit dislocations is reduced in the range where the lattice mismatch between quaternary InAlGaN and GaN is kept small.

According to the inventors' knowledge, the lattice relaxation is less likely to occur in the direction perpendicular to the inclination direction of the semipolar primary surface. However, the lattice relaxation in the perpendicular direction leads to generation of threading dislocations in the epitaxially grown $In_{X2}Al_{Y2}Ga_{1-X2-Y2}N$ layer 27. The generation of the dislocations adversely affects device characteristics. In InAlGaN having a relatively high Al composition, a lattice match condition in the direction parallel to the inclination direction of the semipolar primary surface is different from an off perpendicular lattice match condition and thus this condition is more suitable for high Al compositions of InAlGaN. Since the $In_{X2}Al_{Y2}Ga_{1-X2-Y2}N$ layer 27 can act as an electron block layer, this electron block layer comprises InAlGaN with a relatively high Al composition. For provision of good device characteristics, it is preferable to satisfy the prescription of the lattice mismatch degree in the direction perpendicular to the inclination direction of the semipolar primary surface.

When the c-axis of GaN is inclined toward the a-axis, the same lattice mismatch degree can also be defined, and in this case, it can be in the following range using the lattice mismatch degree F27N "$(V2N_T-V0N_T)/V0N_T$":

$$-0.5\% \leq F27N \leq 0.2\%.$$

When the lattice mismatch is set in the above range to achieve a lattice match between lattice constants in the direction perpendicular to the inclination direction of the c-axis (e.g., lattice constants on the a-axis), the lattice constant of InAlGaN in the inclination direction of the c-axis becomes smaller than that of GaN (lattice constant in the inclination direction of the c-axis).

When a small off angle in inclination of the c-axis direction with respect to the m-axis is zero and the c-axis is inclined toward the m-axis, the lattice mismatch degree F27N perpendicular to the inclination direction can be defined using transverse components in the direction perpendicular to both of the c-axis and the normal axis.

Figure 5:
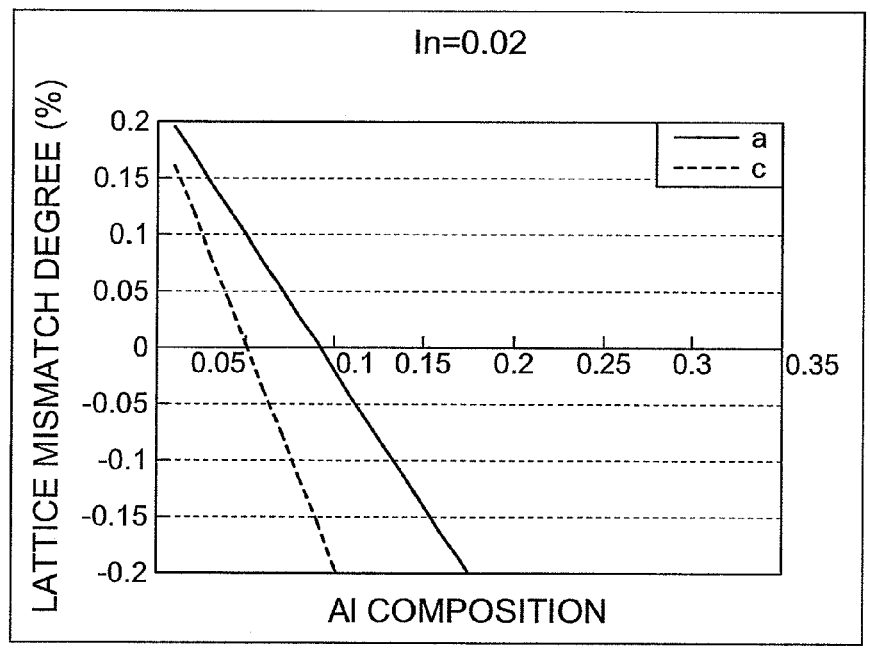
FIG. 5 is a drawing showing relations of Al composition in InAlGaN (In composition=0.02 or 0.05) versus lattice mismatch degree in c-axis and a-axis directions.
Figure 5:
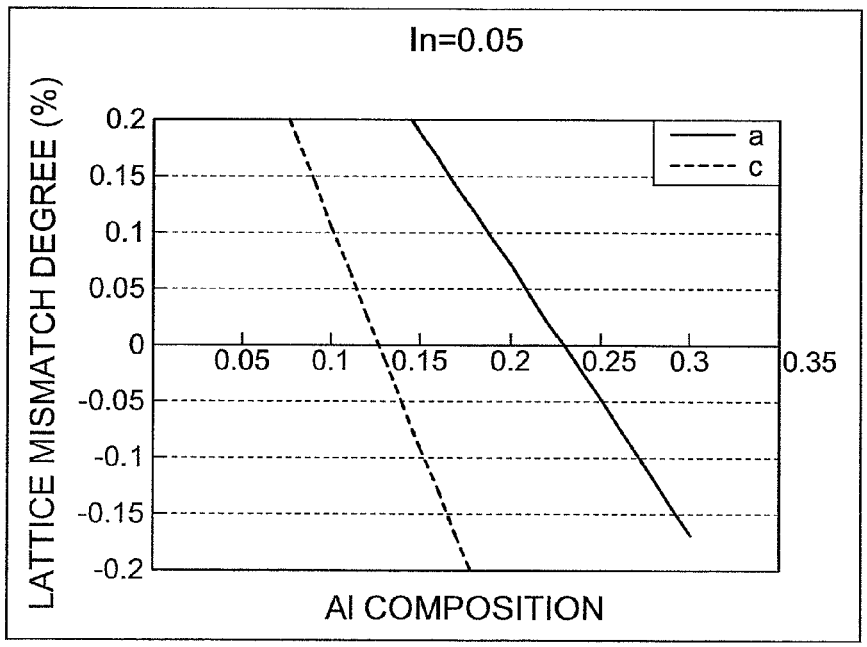

FIG. 5 is a drawing showing relations of Al composition versus lattice mismatch degree in the c-axis and a-axis directions in InAlGaN (In composition=0.02 or 0.05). With reference to FIG. 5(a), there are shown lattice mismatch degrees in the c-axis and a-axis directions in InAlGaN with the relatively low In composition. The low In composition needs a low Al composition to obtain lattice match. When the lattice match is achieved in either of the a-axis and the c-axis, the other lattice mismatch degree is made small. With reference to FIG. 5(b), there are shown lattice mismatch degrees in the c-axis and a-axis directions in InAlGaN with the relatively high In composition. The high In composition needs a high Al composition to obtain lattice match. In this case, when the lattice match is achieved in either one, the other lattice mismatch degree becomes very large. If relaxation occurs in the a-axis direction, a defect penetrating the epitaxial film could be made; therefore, it is preferable to make the lattice mismatch degree in the a-axis direction small.

The In composition X2 of the $In_{X2}Al_{Y2}Ga_{1-X2-Y2}N$ layer 27 can be not less than 0.01. This In composition X2 can be not more than 0.06. This composition range allows the lattice constant of InAlGaN to be made closer to that of GaN, and this In composition range is useful for not increasing the Al composition providing InAlGaN with the bandgap for the electron block layer.

The Al composition Y2 of the $In_{X2}Al_{Y2}Ga_{1-X2-Y2}N$ layer 27 can be not less than 0.05. This Al composition Y2 can be not more than 0.30. This Al composition range is useful for providing InAlGaN with the bandgap for the electron block layer.

The p-type GaN-based semiconductor cladding layer 33 makes a junction J4 with the $In_{X2}Al_{Y2}Ga_{1-X2-Y2}N$ layer 27. The p-type cladding layer 33 includes an $In_{X3}Al_{Y3}Ga_{1-X3-Y3}N$ (0<X3<1, 0<Y3<1, 0<X3+Y3<1) layer, and the $In_{X3}Al_{Y3}Ga_{1-X3-Y3}N$ layer constitutes at least a part of the p-type cladding layer 33. In the description hereinafter, the p-type cladding layer 33 has the $In_{X3}Al_{Y3}Ga_{1-X3-Y3}N$ layer 33 (hereinafter referred to as "InAlGaN layer 33"). The thickness of this InAlGaN layer 33 can be not less than 300 nm. The thickness of this InAlGaN layer 33 can also be not more than 1500 nm. When the InAlGaN layer 33 is used in addition to the InAlGaN layer 21, misfit dislocations are reduced in the p-type semiconductor layer 19 and the n-type semiconductor layer 15 which are disposed on both sides of the light emitting layer 17.

Misfit dislocations due to the slip plane primarily of the c-plane are introduced to AlGaN on a semipolar plane to induce lattice relaxation in AlGaN on the semipolar plane. For this reason, quaternary InAlGaN capable of reducing internal strain is applicable to epitaxial growth on the underlying layer of the light emitting layer having the semipolar primary surface. For example, quaternary InAlGaN can provide the lattice constant d(InAlGaN) closer to the lattice constant d(GaN) of GaN than the lattice constant d(AlGaN) of AlGaN with the same bandgap as that of the InAlGaN. Quaternary InAlGaN can also provide the lattice constant d(InAlGaN) closer to the lattice constant d(GaN) of GaN than the lattice constant d(AlGaN) of AlGaN with the same refractive index as that of the InAlGaN.

Specifically, a lattice vector LVC3 represents a c-axis direction of a semiconductor material (unstrained) for the InAlGaN layer 33 and a magnitude of a lattice constant d3 thereof in the c-axis direction. This lattice vector LVC3 includes a longitudinal component $V3_L$ in the direction of the normal axis Ax and a transverse component $V3_T$ perpendicular to the longitudinal component. This vector is expressed by (longitudinal component, transverse component) as follows:

$$LVC3=(V3_L, V3_T).$$

According to this notation, a lattice mismatch degree F33 in the transverse direction to the c-axis is defined as follows:

$$F33=(V3_T-V0_T)/V0_T.$$

The lattice vector LVC0 is expressed as $LVC0=(V0_L, V0_T)$. The lattice mismatch degree F33 in the InAlGaN layer 33 can be not less than −0.15%. The lattice mismatch degree F33 can also be not more than 0.2%. With the InAlGaN layer 33 providing the lattice mismatch degree F33 in this range, the lattice constant of InAlGaN in this composition is close to that of GaN and therefore the misfit dislocation density can be reduced at the interface between the InAlGaN layer 33 and the underlying electron block layer 27. Introduction of misfit dislocations can be reduced by keeping the lattice mismatch small between quaternary InAlGaN and GaN of the support base 13.

Strain in the InAlGaN layer 33 will be described with reference to FIGS. 2, 3, and 4. With reference to FIG. 2(a), there is shown the c-axis vector VC1 of GaN and as indicated by the vector VC1, the c-axis of GaN is inclined toward the m-axis. In this inclination direction, the c-plane of GaN is inclined with respect to the primary surface of GaN. When InAlGaN is epitaxially grown directly on this GaN or on a semiconductor strained in accordance with the lattice constant of GaN as shown in FIG. 2(b), the lattice mismatch between this GaN and InAlGaN in the inclination direction of the c-axis can be in the following range using the previously described lattice mismatch degree F33 "$(V3_T-V0_T)/V0_T$":

$$-0.15\% \leq F33 \leq 0.2\%.$$

With the InAlGaN layer 33 providing the lattice mismatch degree F33 in this range, the lattice constant of InAlGaN in this composition is close to that of GaN and introduction of misfit dislocations is reduced by keeping the lattice mismatch small between quaternary InAlGaN and GaN. When the lattice mismatch is set in the foregoing range to achieve a lattice match on the projected axis of the c-axis, the lattice constant of InAlGaN in the direction perpendicular to the inclination direction of the c-axis becomes larger than the lattice constant of GaN (lattice constant in the direction perpendicular to the inclination direction).

When the c-axis of GaN is inclined toward the a-axis, the same lattice mismatch degree can also be defined and in this case the lattice mismatch degree F33 "$(V3_T-V0_T)/V0_T$" can also be used and can be in the following range:

$$-0.15\% \leq F33 \leq 0.2\%.$$

When the inclination direction of the semipolar primary surface is a direction from the c-axis to the m-axis of GaN, the lattice mismatch degree in the direction of the a-axis can be defined. As described previously, the direction of the a-axis in GaN and a magnitude of a lattice constant d0N thereof in the a-axis direction are represented by a lattice vector LVN0. This lattice vector LVN0 consists of a longitudinal component $V0N_L$ in the direction of the normal axis Ax and a transverse component $V0N_T$ perpendicular to the longitudinal component. A direction of the a-axis of a semiconductor material for the InAlGaN (i.e., $In_{X3}Al_{Y3}Ga_{1-X3-Y3}N$) layer and a magnitude of a lattice constant d3N in the a-axis direction are represented by a lattice vector LVN3. The lattice vector LVN3 consists of a longitudinal component $V3N_L$ in the direction of the normal axis Ax and a transverse component $V3N_T$ perpendicular to the longitudinal component. These vectors are expressed by (longitudinal component, transverse component) as follows:

$$LVN0=(V0N_L, V0N_T);$$

$$LVN3=(V3N_L, V3N_T).$$

According to this notation, the lattice mismatch degree F33N in the transverse direction is defined as follows:

$$F33N=(V3N_T-V0N_T)/V0N_T.$$

With reference to FIG. 3(a), the c-axis vector VC1 of GaN is shown and the c-axis of GaN is inclined toward the m-axis as indicated by the vector VC1. In this inclination direction, the c-plane of GaN is inclined with respect to the primary surface of GaN. When InAlGaN is epitaxially grown on this GaN as shown in FIG. 3(b), the lattice mismatch between this GaN and InAlGaN in the direction of the a-axis can be within the following range using the previously-described lattice mismatch degree F33N "$(V3N_T-V0N_T)/V0N_T$":

$-0.15\% \leq F33N \leq 0.2\%$.

With the InAlGaN layer 33 providing the lattice mismatch degree F33N in this range, the lattice constant of InAlGaN in this composition is close to that of GaN and the misfit dislocation density can be reduced at the interface between the $In_{X3}Al_{Y3}Ga_{1-X3-Y3}N$ layer and the underlying layer. Introduction of misfit dislocations is reduced in the range where the lattice mismatch between quaternary InAlGaN and GaN is kept small.

According to the inventors' knowledge, the lattice relaxation is less likely to occur in the direction perpendicular to the inclination direction of the semipolar primary surface. However, occurrence of lattice relaxation in the perpendicular direction leads to generation of threading dislocations in the epitaxially grown $In_{X3}Al_{Y3}Ga_{1-X3-Y3}N$ layer. The generation of the dislocations adversely affects device characteristics. The lattice match condition in the direction parallel to the inclination direction of the semipolar primary surface and the lattice match condition perpendicular to the off direction are different from each other, as illustrated, in InAlGaN with a relatively high Al composition. Therefore, this condition is more suitable for high Al compositions of InAlGaN.

When the c-axis of GaN is inclined toward the a-axis, the same lattice mismatch degree can also be defined and in this case, it can be in the following range using the lattice mismatch degree F33N "$(V3N_T-V0N_T)/V0N_T$":

$-0.15\% \leq F33N \leq 0.2\%$.

When the lattice mismatch is set in the above range to achieve a lattice match between lattice constants in a direction perpendicular to the inclination direction of the c-axis (e.g., lattice constants on the a-axis), the lattice constant of InAlGaN in the inclination direction of the c-axis becomes smaller than that of GaN (lattice constant in the inclination direction of the c-axis).

When a small off angle in the inclination of the c-axis with respect to the m-axis is substantially zero and the inclination direction of the c-axis is inclined toward the m-axis, the lattice mismatch degree F33N perpendicular to the inclination direction can be defined using transverse components in the direction perpendicular to both of the c-axis and the normal axis.

In crystals of GaN, InN, and AlN, since these respective ratios of a-axis lattice constant to c-axis lattice constant are not the same, InAlGaN does not allow simultaneous achievement of lattice matches in two orthogonal directions at the interface between GaN or a semiconductor strained in accordance with the lattice constant of GaN, and InAlGaN. According to the inventors' knowledge, however, there are lattice mismatch ranges which can be realized in two orthogonal directions.

When InAlGaN is epitaxially grown on this GaN (or on a semiconductor strained in accordance with the lattice constant of GaN) as shown in FIG. 4, the lattice mismatch between this GaN and InAlGaN in the inclination direction of the c-axis can be in the following range using the previously described lattice mismatch degree F33 "$(V3_T-V0_T)/V0_T$":

$-0.15\% \leq F33 \leq 0\%$.

The lattice mismatch between this GaN and InAlGaN in the inclination direction of the a-axis can be in the following range using the previously described lattice mismatch degree F33N "$(V3N_T-V0N_T)/V0N_T$":

$0\% \leq F33N \leq 0.2\%$.

However, F33 and F33N are not zero at the same time. The relations of the lattice mismatch degrees F33 and F33N show the following: the lattice constant of InAlGaN in the inclination direction of the c-axis is smaller than that of GaN in the same direction; the lattice constant of InAlGaN in the direction perpendicular to the inclination direction of the c-axis is larger than that of GaN in the same direction.

The In composition X3 of the InAlGaN layer 33 for the p-type cladding layer can be not less than 0.01. This In composition X3 can be not more than 0.06. This composition range permits the lattice constant of InAlGaN to be made closer to that of GaN, and InAlGaN in this In composition range is useful for providing the bandgap for the cladding layer.

The Al composition Y3 of the InAlGaN layer 33 for the p-type cladding layer can be not less than 0.05. This Al composition Y3 can be not more than 0.30. InAlGaN in this Al composition range is useful for providing the bandgap for the cladding layer.

The p-type GaN-based semiconductor contact layer 35 makes a junction J5 with the InAlGaN layer 33. The p-type contact layer 35 can comprise, for example, AlGaN, GaN, or the like.

The nitride semiconductor photonic device 11 can include a first electrode 41 (e.g., anode) provided on the contact layer 35, and the first electrode 41 is in contact with the contact layer 35 through an aperture 43a of an insulator layer 43. The aperture 43a has a stripe shape extending in the X-axis direction. The insulator layer 43 covers the contact layer 35. The first electrode 41 used herein is made of, for example, Ni/Au. The nitride semiconductor photonic device 11 can include a second electrode 45 (e.g., cathode) provided on the back surface 13b of the support base 13 and the second electrode 45 comprises, for example, Ti/Al.

The active layer 17 generates light L1 in response to an external voltage applied between the electrodes 41, 45, and in the present embodiment the semiconductor photonic device 11 includes an edge light emitting device. In this active layer 17, the piezoelectric field is small.

The angle of inclination of the semipolar primary surface 13a can be in the range of not less than 63 degrees and not more than 80 degrees or in the range of not less than 100 degrees and not more than 117 degrees. According to the inventors' knowledge, misfit dislocations due to the c-plane slip plane are likely to occur in these angular ranges. The influence of the piezoelectric field can be reduced in the foregoing angular ranges.

Figure 6:
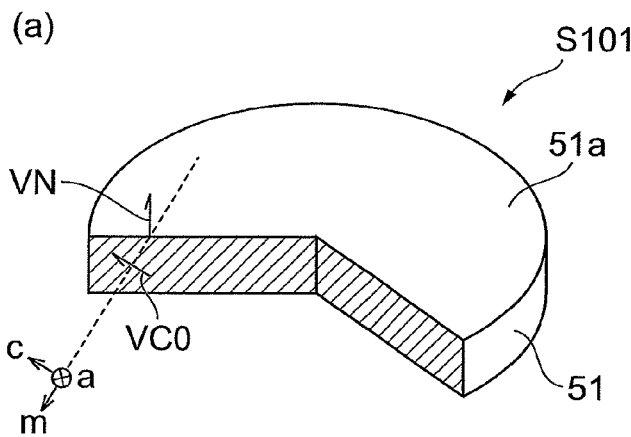
FIG. 6 is a drawing showing major steps in a method for fabricating a nitride semiconductor light emitting device and an epitaxial wafer on a GaN substrate.
Figure 6:
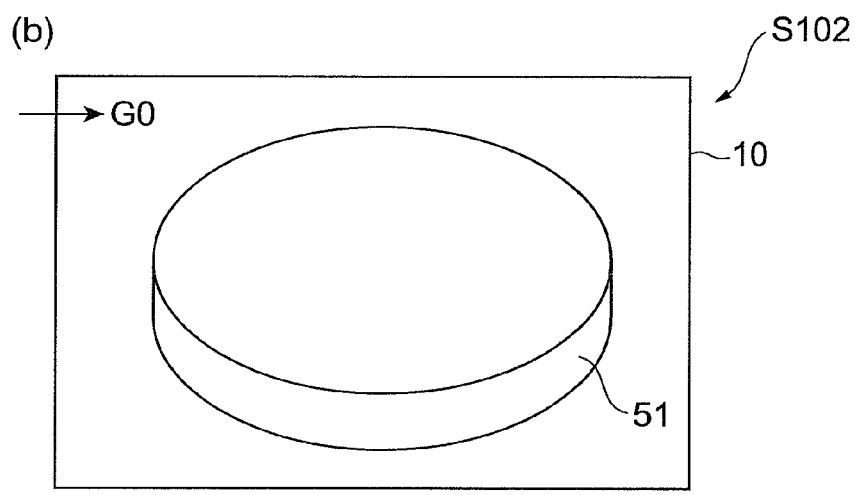
Figure 6:
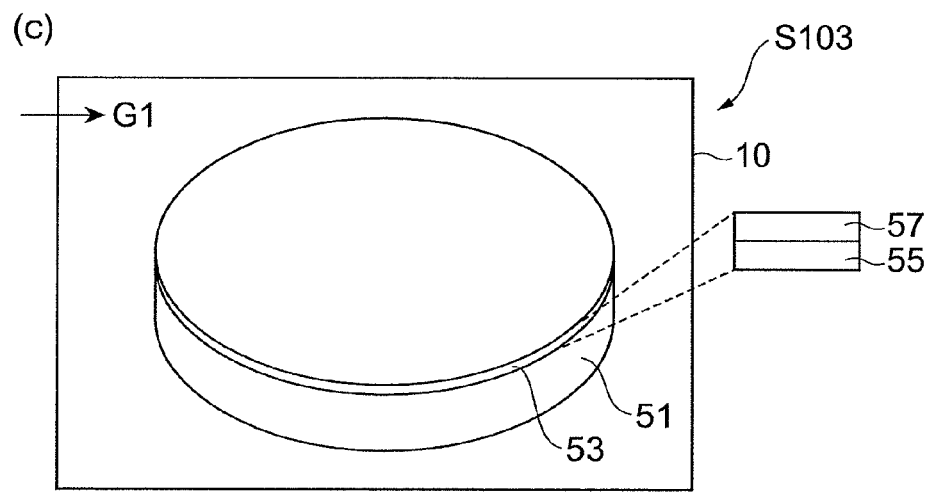
Figure 7:
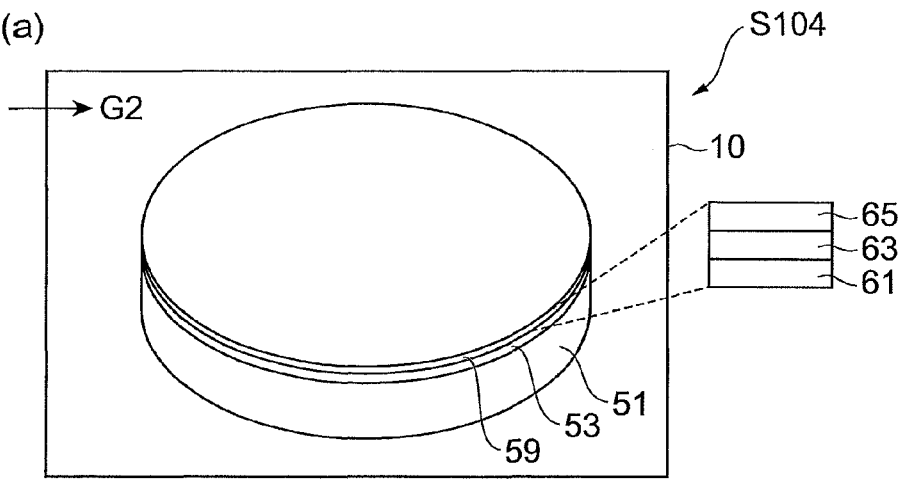
FIG. 7 is a drawing showing major steps in the method for fabricating the nitride semiconductor light emitting device and the epitaxial wafer on the GaN substrate.
Figure 7:
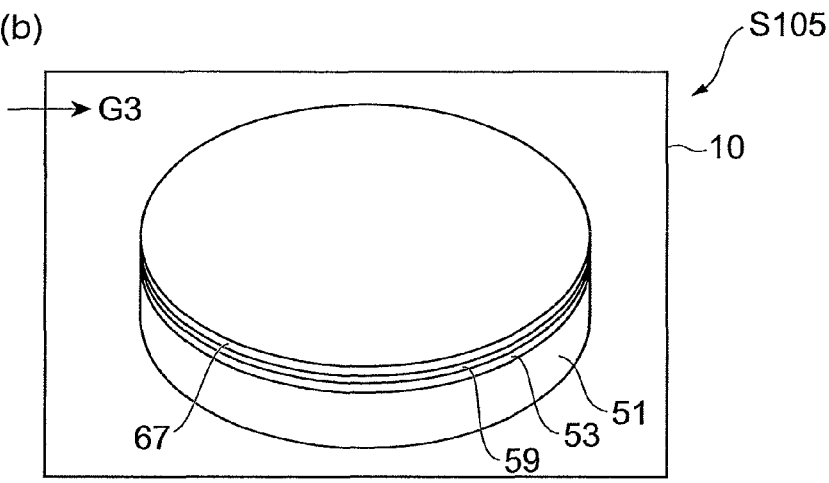
Figure 7:
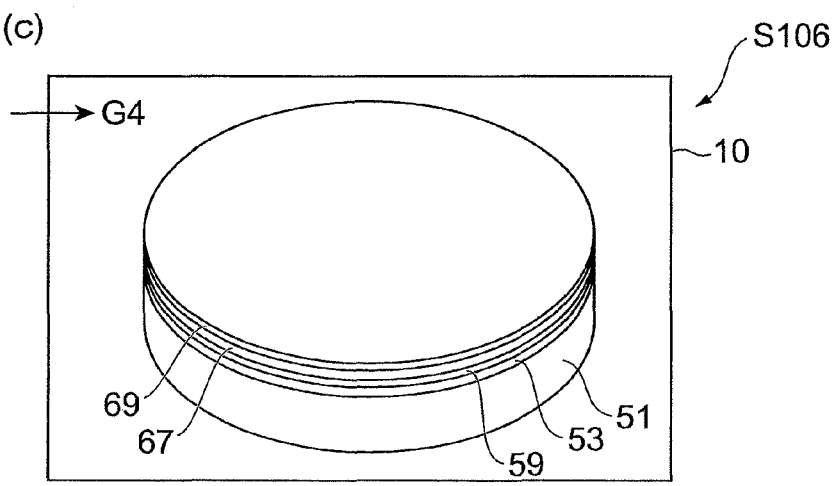
Figure 8:
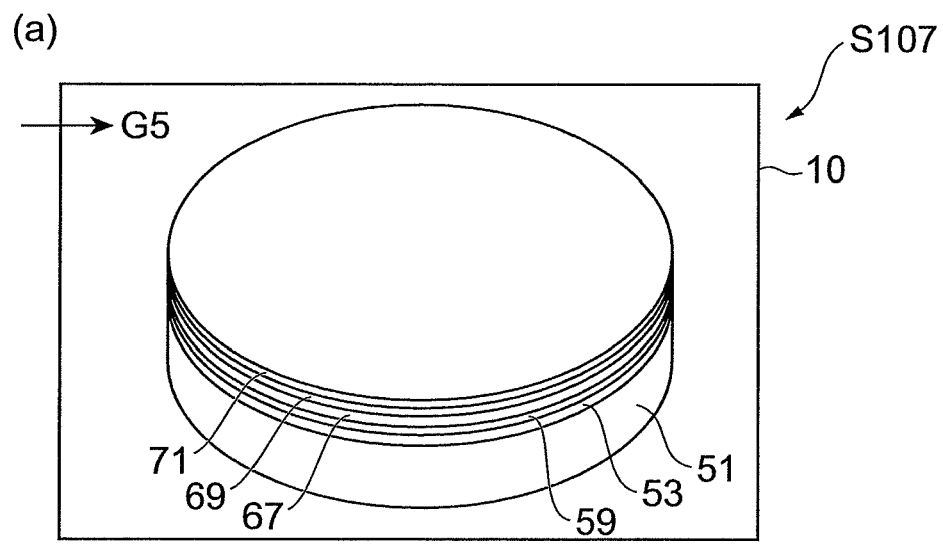
FIG. 8 is a drawing showing major steps in the method for fabricating the nitride semiconductor light emitting device and the epitaxial wafer on the GaN substrate.
Figure 8:
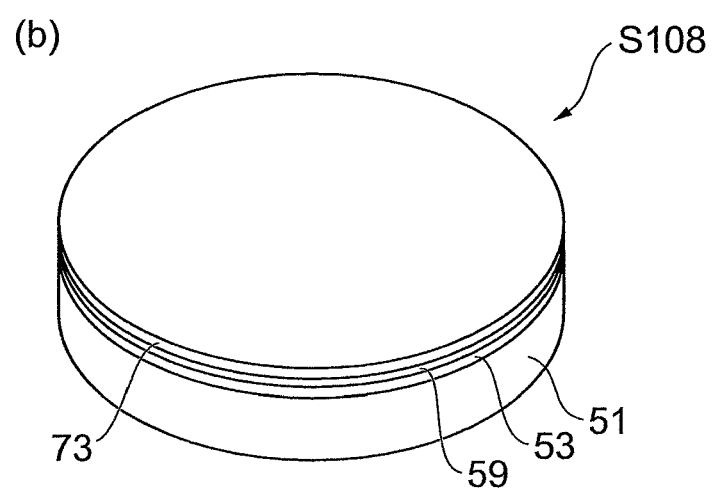

The nitride semiconductor light emitting device and epitaxial substrate are made on a GaN substrate by organometallic vapor-phase epitaxy in accordance with steps shown in FIGS. 6, 7 and 8. Raw materials for the epitaxial growth used herein are as follows: trimethyl gallium (TMG); trimethyl indium (TMI); trimethyl aluminum (TMA); ammonia ($NH_3$); silane ($SiH_4$); and bis(cyclopentadienyl) magnesium ($Cp_2Mg$).

In step S101, prepare a GaN substrate 51 is prepared. As shown in FIG. 6(a), the GaN substrate 51 has a semipolar primary surface 51a, and an angle of inclination thereof is in the range of not less than 10 degrees and not more than 80 degrees or in the range of not less than 100 degrees and not more than 170 degrees. A direction of inclination of the c-axis can be either one of directions to the m-axis and the a-axis. For example, when the primary surface of the substrate is inclined at an angle of 75 degrees to the direction of the m-axis from the c-plane, this inclined surface is represented by (20-21) plane. The primary surface of the substrate is mirror-polished.

Epitaxial growth is carried out under the following conditions on the GaN substrate 51. First, in step S102, the GaN substrate 51 is placed in a growth reactor 10. Thereafter, as shown in FIG. 6(*b*), a thermal treatment is carried out at the temperature of 1050 Celsius degrees while supplying a gas G0 containing $NH_3$ and $H_2$, to the growth reactor 10.

After this thermal treatment, in step S103, an n-type GaN-based semiconductor region 53 is grown while supplying a source gas G1 to the growth reactor 10, as shown in FIG. 6(*c*). For example, at 1050 Celsius degrees, the source gas is supplied to the growth reactor 10 to grow a Si-doped GaN layer 55. This source gas contains, for example, TMG, $NH_3$, and $SiH_4$. The thickness of the n-type GaN layer 55 is, for example, 500 nanometers. The GaN substrate 51 and GaN layer 55 can provide a support base for the semiconductor light emitting device 11. Next, for example, at 840 Celsius degrees, a source gas is supplied to the growth reactor to grow a Si-doped InAlGaN layer 57. This source gas contains TMG, TMI, TMA, $NH_3$, and $SiH_4$. The thickness of the InAlGaN layer 57 is, for example, 1.5 micrometers. Since this InAlGaN layer 57 is grown on a semipolar plane, the c-plane of the InAlGaN layer 57 is inclined with respect to a normal to the primary surface 51*a* of the GaN substrate 51. However, the InAlGaN layer 57 has a group III composition providing the lattice constant closer to that of GaN than the lattice constant of AlGaN with the same bandgap as that of the InAlGaN layer 57. The foregoing composition of the InAlGaN layer 57 suppresses introduction of misfit dislocations, so as to control occurrence of lattice relaxation. In the preferable example, the lattice constant of the InAlGaN layer 57 is lattice-matched with GaN. However, the present embodiment is not limited thereto.

Next, a source gas G2 is supplied to the growth reactor 10 to form a light emitting layer 59 on the InAlGaN layer 57. First, the source gas is supplied at the substrate temperature of 840 Celsius degrees to the growth reactor 10 to grow an optical guide layer 61. The source gas contains, for example, TMG, TMI, and $NH_3$. The c-plane of the optical guide layer 61 is inclined according to the primary surface of the substrate. The optical guide layer 61 can be, for example, an undoped InGaN layer. The thickness of the undoped InGaN layer is, for example, 100 nm. An In composition of the InGaN layer is, for example, 0.03.

Then an active layer 63 in a quantum well structure is grown. A barrier layer growth step is to supply a source gas at a substrate temperature of growth temperature T1 to the growth reactor, thereby growing a barrier layer of the active layer 63 on the optical guide layer 61. This barrier layer can comprise, for example, undoped GaN and the growth temperature T1 can be, for example, 840 Celsius degrees. This source gas contains TMG and $NH_3$. The thickness of this GaN layer can be 15 nm. After the growth of the barrier layer, the growth is stopped and the temperature is changed from the temperature T1 to temperature T2. A source gas is supplied at a substrate temperature of temperature T2 to the growth reactor 10, thereby growing a well layer of the active layer 61 on the barrier layer. This well layer can comprise, for example, undoped InGaN and the growth temperature T2 can be, for example, 790 Celsius degrees. This source gas can contain TMG, TMI, and $NH_3$. The thickness of this InGaN layer is 3 nm and its In composition is 0.18. After this, the growth of the barrier layer and well layer is repeated to complete the formation of the active layer 63. The c-planes of the well layers and barrier layers in the active layer 63 are inclined similarly in accordance with the inclination of the primary surface of the substrate.

After the growth of the active layer 63, a source gas is supplied at the substrate temperature of 840 Celsius degrees to the growth reactor 10 to grow an optical guide layer 65. The c-plane of the optical guide layer 65 is similarly inclined in accordance with the inclination of the primary surface of the substrate. The optical guide layer 65 can be, for example, an undoped InGaN layer. The source gas can contain, for example, TMG, TMI, and $NH_3$. The thickness of the undoped InGaN layer is, for example, 100 nm. An In composition of the InGaN layer is, for example, 0.03.

After the growth of the light emitting layer 59, in step S105 a source gas G3 is supplied to the growth reactor 10 to grow an electron block layer 67. The electron block layer 67 can comprise, for example, AlGaN or InAlGaN. When the electron block layer 67 comprises AlGaN, the substrate temperature can be, for example, 1000 Celsius degrees. When the electron block layer 67 comprises InAlGaN, the substrate temperature can be, for example, 840 Celsius degrees. The substrate temperature can be not less than 800 Celsius degrees and not more than 900 Celsius degrees. In this case, thermal stress on the active layer can be reduced by growth of the InAlGaN electron block layer.

In step S106, a source gas G4 is supplied to the growth reactor 10 to grow a p-type cladding layer 69. The p-type cladding layer 69 can comprise, for example, AlGaN or InAlGaN. When the p-type cladding layer 69 comprises AlGaN, the substrate temperature can be, for example, 1000 Celsius degrees. When the p-type cladding layer 69 comprises InAlGaN, the substrate temperature can be, for example, 840 Celsius degrees. The substrate temperature can be not less than 800 Celsius degrees and not more than 900 Celsius degrees. In this case, thermal stress on the active layer can be reduced by growth of the p-type InAlGaN cladding layer 69.

Since the electron block layer 67 and the cladding layer 69 are grown at the growth temperature in the range of not less than 800 Celsius degrees and not more than 900 Celsius degrees after the growth of the light emitting layer 59, this growth temperature is lower than that of the AlGaN electron block layer and AlGaN cladding layer. For this reason, thermal stress on the light emitting layer 59 is reduced during the growth of the electron block layer 67 and the cladding layer 69.

In step S107, a source gas G5 is supplied to the growth reactor 10 to grow a p-type contact layer 71. The p-type contact layer 71 can comprises, for example, GaN, AlGaN, or InAlGaN. When the p-type contact layer 71 comprises GaN, the substrate temperature can be, for example, 1000 Celsius degrees. When the electron block layer 67 and cladding layer 69 comprises InAlGaN, the substrate temperature of the p-type contact layer 71 can be, for example, 840 Celsius degrees. This substrate temperature can be not less than 800 Celsius degrees and not more than 900 Celsius degrees. In this case, thermal stress on the active layer can be reduced by growth of the p-type InAlGaN contact layer.

The active layer on the semipolar plane of the GaN substrate is sensitive to high temperature in growth of the p-layer and is easy to deteriorate during growth of the p-layer. At the optimal temperature for the growth of the p-type region on the c-plane (e.g., approximately 1000 Celsius degrees), macro dark regions spread, particularly, during growth of a long-wavelength active layer. The dark regions herein mean non-emission regions in a fluorescence microscope image. The spread of dark regions at the high temperature during growth of the p-layer is prevented by decreasing the growth temperature of the p-layer or by increasing a duration of low growth temperature of the p-layer.

In step S108, an epitaxial wafer E is taken for the nitride semiconductor light emitting device out of the growth reactor 10. This epitaxial substrate E has the substrate 51, the $In_{X1}Al_{Y1}Ga_{1-X1-Y1}N$ layer 57 on this substrate 51, the light emitting layer 59 including the InGaN layer on the InAlGaN layer 57, and the p-type GaN-based semiconductor layer 71 above the light emitting layer 59. The c-plane of the InAlGaN layer 57 is inclined with respect to the normal axis normal to the primary surface 51a of the GaN substrate 51.

This epitaxial substrate E is provided with the InAlGaN layer 57 between the InGaN layer of the light emitting layer 59 and the GaN substrate 51. This InAlGaN layer 57 having a bandgap of not less than that of hexagonal GaN provides the confinement of carriers and light in the light emitting layer 61. Since the thickness of the InAlGaN layer 57 is larger than that of the quantum well structure, misfit dislocations are more likely to occur with AlGaN having the bandgap comparable to that of the InAlGaN layer 57. Although the c-plane of the InAlGaN layer 57 is inclined with respect to the normal axis, the density of misfit dislocations due to the slip plane primarily of the c-plane is reduced, in comparison to AlGaN, by adjustment of the lattice constant based on the composition of the quaternary InAlGaN layer.

This epitaxial substrate E can further comprise the electron block layer 67 provided between the p-type GaN-based semiconductor layer 71 and the light emitting layer 59. The electron block layer 67 can comprise an $In_{X2}Al_{Y2}Ga_{1-X2-Y2}N$ layer. The c-plane of this InAlGaN layer is inclined with respect to the aforementioned normal axis. Since the electron block layer 67 comprises this quaternary InAlGaN layer, misfit dislocations are reduced at the junction between the electron block layer 67 and the light emitting layer 59.

This epitaxial substrate E can further comprise the p-type cladding layer 69 provided between the p-type GaN-based semiconductor layer 71 and the light emitting layer 59. The p-type cladding layer 69 can comprise an $In_{X3}Al_{Y3}Ga_{1-X3-Y3}N$ layer. The c-plane of this InAlGaN layer is inclined with respect to the aforementioned normal axis. Since the cladding layer 69 comprises the quaternary InAlGaN layer, misfit dislocations are reduced at the junction between the cladding layer 69 and the electron block layer 67. The epitaxial substrate may further comprise an optical guide layer between the electron block layer 67 and the p-type cladding layer 69. In this case, since the cladding layer 69 comprises the quaternary InAlGaN layer, misfit dislocations are reduced at the junction between the cladding layer 69 and the optical guide layer.

Next, a p-electrode (Ni/Au) and a p-pad electrode (Ti/Au) are formed on the p-type GaN contact layer 71 of this epitaxial substrate E and an n-electrode (Ti/Al) is formed on the polished back surface of the GaN substrate 51. After this, the electrodes are annealed (e.g., at 550 Celsius degrees for one minute). This step completes the nitride semiconductor light emitting device.

EXAMPLE 1

Figure 9:
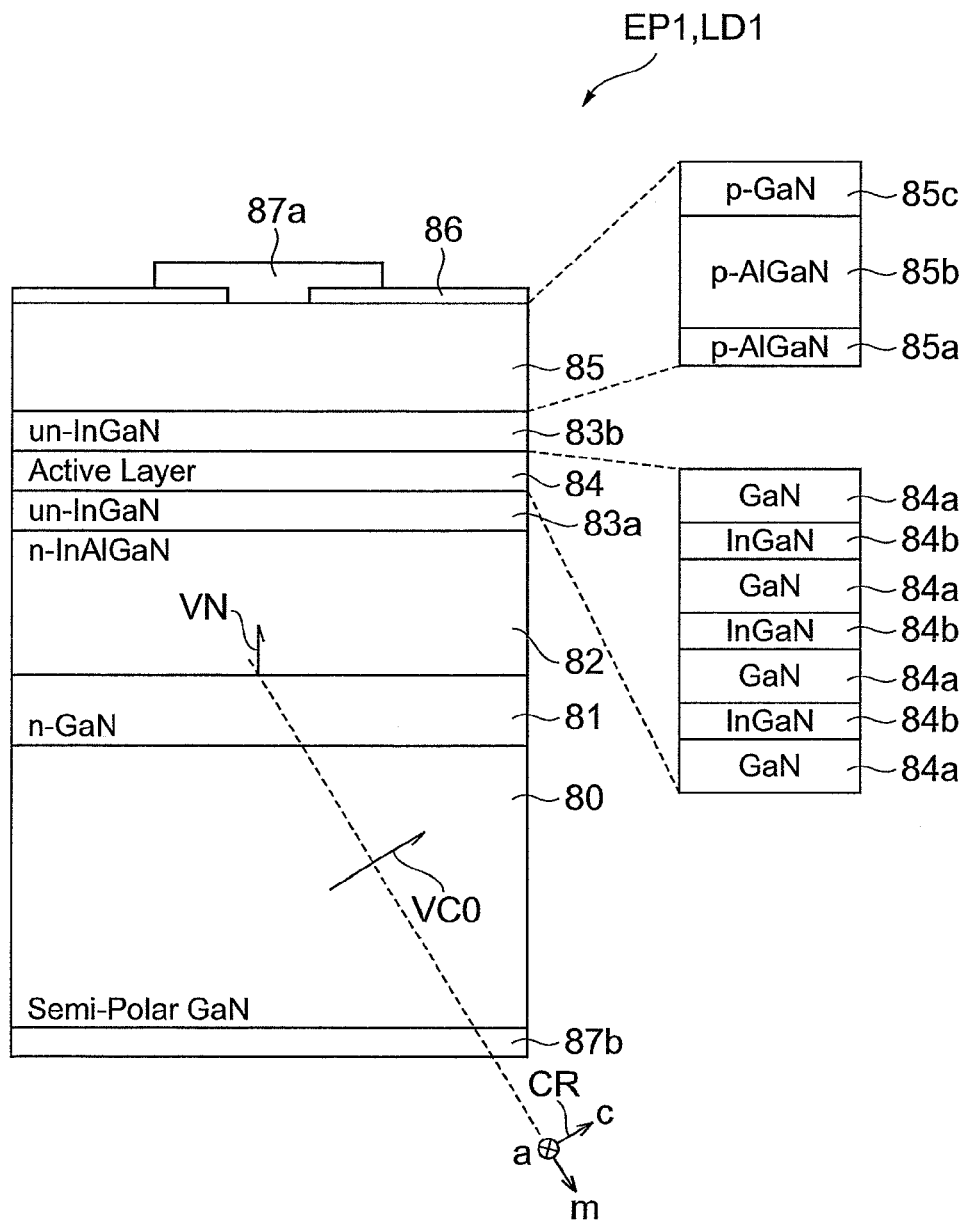
FIG. 9 is a drawing schematically showing a semiconductor laser structure including an n-type InAlGaN cladding layer made on a GaN substrate, in Example 1.

A semipolar GaN substrate 80 having a primary surface of (20-21) plane is prepared. The (20-21) plane is inclined at an angle of 75 degrees with respect to the m-axis direction from the reference of the c-plane. An epitaxial multilayer structure for a semiconductor laser structure shown in FIG. 9 is made on this GaN substrate 80 by organometallic vapor-phase epitaxy. While supplying ammonia and hydrogen to a growth reactor, the GaN substrate 80 is thermally treated at the substrate temperature of 1050 Celsius degrees. The thermal treatment time is about 10 minutes. After completion of this preprocessing (thermal cleaning), TMG, $NH_3$ and $SiH_4$ are supplied to the growth reactor to grow a Si-doped n-type GaN layer 81 on the GaN substrate 80 at 1050 Celsius degrees. The surface of the GaN layer 81 is also semipolar. A normal vector VN to the surface of the GaN layer 81 is inclined relative to the c-axis vector VC0. After the substrate temperature is changed to 840 Celsius degrees, TMG, TMI, TMA, $NH_3$, and $SiH_4$ are supplied to the growth reactor to grow an $In_{0.02}Al_{0.09}Ga_{0.89}N$ cladding layer 82 on the Si-doped n-type GaN layer 81. The thickness of this cladding layer 82 is 1.5 μm. The bandgap energy of $In_{0.02}Al_{0.09}Ga_{0.89}N$ is about 3.54 electron volts (eV). $In_{0.02}Al_{0.09}Ga_{0.89}N$ is almost lattice-matched with GaN. The c-plane of the n-type cladding layer 82 is inclined with respect to the normal vector VN to the surface of the GaN layer 81. For this reason, misfit dislocations can be generated with the c-plane acting as a slip plane in this cladding layer 82. However, use of the quaternary GaN-based semiconductor can reduce the misfit dislocations.

After this, a light emitting layer is grown thereon. First, TMG, TMI, and $NH_3$ are supplied to the growth reactor to grow an undoped $In_{0.03}Ga_{0.97}N$ optical guide layer 83a on the n-type $In_{0.02}Al_{0.09}Ga_{0.89}N$ layer 82 at 840 Celsius degrees. The thickness of this optical guide layer 83a is 100 nm. An active layer 84 is formed on this optical guide layer 83a. First, at the substrate temperature of 840 Celsius degrees, TMG, TMI and $NH_3$ are supplied to the growth reactor to grow a GaN barrier layer 84a on the undoped InGaN layer 83a. The thickness of this barrier layer 84a is 15 nm. Next, at the substrate temperature of 790 Celsius degrees, TMG, TMI, and $NH_3$ are supplied to the growth reactor to grow an undoped $In_{0.18}Ga_{0.82}N$ well layer 84b on the GaN barrier layer 84a. The thickness of this well layer 84b is 3 nm. The growth of the barrier layer 84a and well layer 84b is repeated in the same manner to form the active layer 84. Next, TMG, TMI, and $NH_3$ are supplied to the growth reactor to grow an undoped $In_{0.03}Ga_{0.97}N$ optical guide layer 83b on the active layer 84 at 840 Celsius degrees. The thickness of this optical guide layer 83b is 100 nm.

After the substrate temperature is changed to 1000 Celsius degrees, a p-type GaN-based semiconductor region 85 is grown on the optical guide layer 83b. First, TMG, TMA, and $NH_3$ are supplied to the growth reactor to grow an $Al_{0.12}Ga_{0.88}N$ electron block layer 85a on the optical guide layer 83b. The thickness of the electron block layer 85a is 20 nm. Without change in substrate temperature, TMG, TMA, $NH_3$, and $Cp_2Mg$ are supplied to the growth reactor to grow a Mg-doped p-type $Al_{0.06}Ga_{0.94}N$ cladding layer 85b on the electron block layer 85a. Furthermore, without change in substrate temperature, TMG, $NH_3$, and $Cp_2Mg$ are supplied to the growth reactor to grow a Mg-doped p-type GaN contact layer 85c on the p-type cladding 85b. An epitaxial substrate EP1 is fabricated through these steps. A peak wavelength of photoluminescence (PL) wavelengths is in the 450 nm band.

Figure 10:
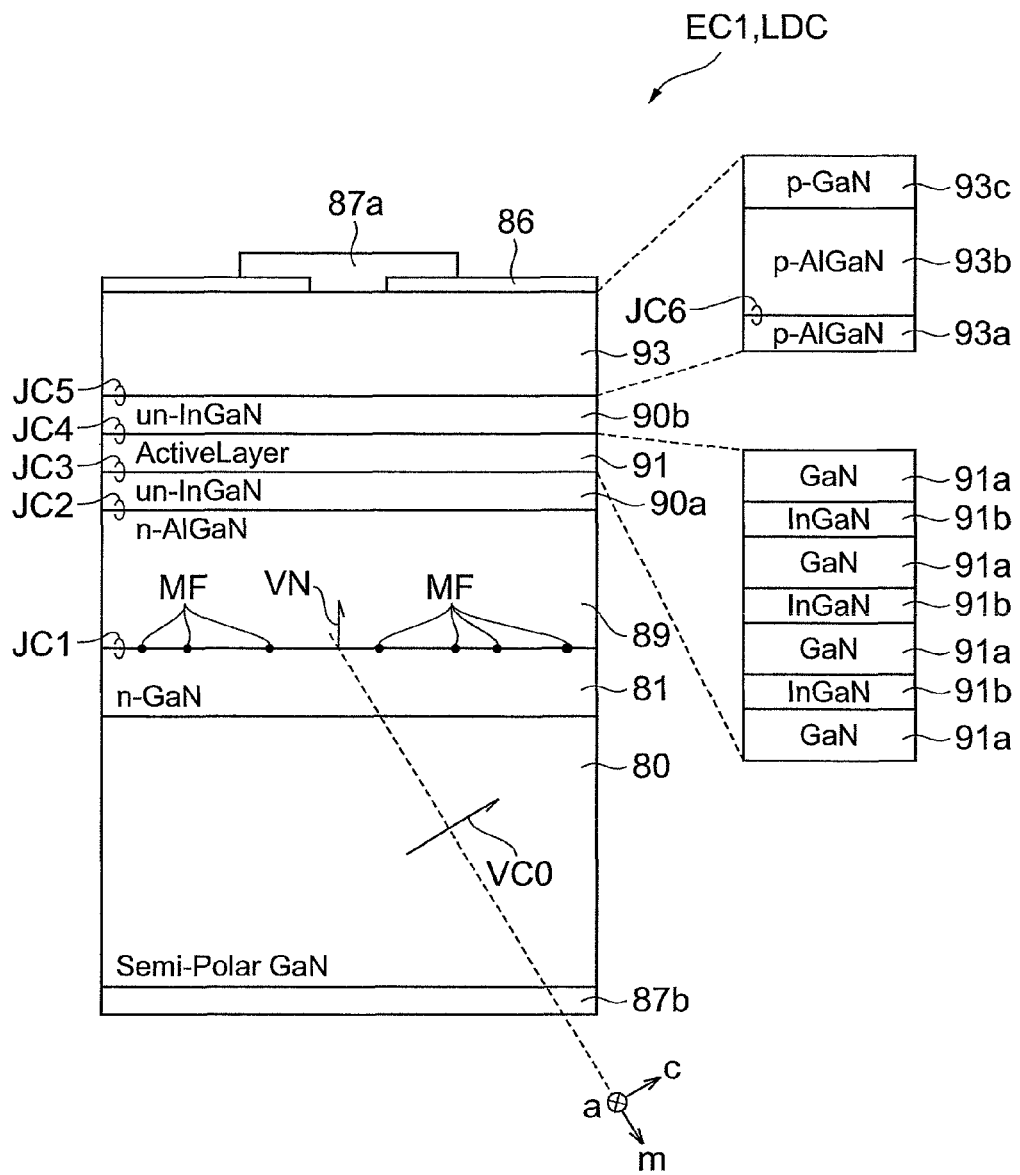
FIG. 10 is a drawing schematically showing a semiconductor laser structure including an n-type AlGaN cladding layer made on a GaN substrate.

Similarly, a semipolar GaN substrate 80 having a primary surface of (20-21) plane is prepared. An epitaxial multilayer structure for a semiconductor laser structure shown in FIG. 10 is made on this GaN substrate 80 by organometallic vapor-phase epitaxy. In the epitaxial multilayer structure, instead of the $In_{0.02}Al_{0.09}Ga_{0.89}N$ cladding layer 82, a Si-doped n-type $Al_{0.05}Ga_{0.95}N$ cladding layer 89 is grown on the Si-doped n-type GaN layer 81 at 1050 Celsius degrees. The thickness of this cladding layer 89 is 1.5 μm. The c-plane of the n-type cladding layer 89 is inclined with respect to the normal vector VN to the surface of the GaN layer 81. For this reason, misfit dislocations can be generated in this cladding layer 82 while the c-plane acts as a slip plane. A lattice mismatch rate between $Al_{0.05}Ga_{0.95}N$ and GaN is 0.2%. The bandgap energy of $Al_{0.05}Ga_{0.95}N$ is approximately 3.54 electron volts (eV).

Epitaxial growth after this step was carried out under the same growth conditions as above. At 840 Celsius degrees, an undoped $In_{0.03}Ga_{0.97}N$ optical guide layer 90a is grown on the n-type AlGaN cladding layer 89. The thickness of this optical guide layer 90a is 100 nm. An active layer 91 is formed on this optical guide layer 90a. The growth temperature of GaN barrier layer 91a is 840 Celsius degrees, and the thickness of the barrier layer 91a is 15 nm. The growth temperature of well layer 91b is 790 Celsius degrees, and the thickness of the well layer 91b is 3 nm. An undoped $In_{0.03}Ga_{0.97}N$ optical guide layer 90b is grown on the active layer 91. The thickness of this optical guide layer 90b is 100 nm. At the substrate temperature of 1000 Celsius degrees, an $Al_{0.12}Ga_{0.88}N$ electron block layer 93a, a Mg-doped p-type $Al_{0.06}Ga_{0.94}N$ cladding layer 93b and a Mg-doped p-type GaN contact layer 93c are grown on the optical guide layer 90b. An epitaxial substrate EC1 is thus fabricated. A peak wavelength of photoluminescence (PL) wavelengths is in the 450 nm band.

On each of the epitaxial substrates EP1 and EC1, a silicon oxide film 86 having a stripe window 10 μm wide is formed, and thereafter a Ni/Au electrode is formed on the top surface of the p-type GaN-based semiconductor region 85 or 93. A Ti/Al electrode 87b is formed on the back surface of the GaN substrate 80. Substrate products are fabricated through these steps.

After the formation of the electrodes, each of the substrate products is cleaved along a-planes with a space of 800 μm to form an optical cavity. A dielectric multilayer film of $SiO_2/TiO_2$ is formed on the cleaved end faces, thereby fabricating gain guiding type semiconductor lasers LD1 and LDC.

The threshold current of the gain guiding type semiconductor laser LD1 is 700 mA. On the other hand, the threshold current of the gain guiding type semiconductor laser LDC is 900 mA.

X-ray reciprocal space mapping measurement is carried out using the epitaxial substrates EP1 and EC1. The results of this measurement show that lattice relaxation occurs in the thick n-type $Al_{0.05}Ga_{0.95}N$ cladding layer. Because of the occurrence of lattice relaxation, misfit dislocations MF are generated at the junction JC1.

On the other hand, no relaxation occurs in the thick $In_{0.02}Al_{0.09}Ga_{0.89}N$ layer. The reason for it is that the n-type quaternary cladding layer has the lattice constant close to that of GaN. In the present example, the composition is intentionally selected and the $In_{0.02}Al_{0.09}Ga_{0.89}N$ layer almost lattice-matched with GaN is grown thereon. This results in that the light emitting layer with the unrelaxed n-type cladding layer demonstrates excellent luminous efficiency and low threshold current.

EXAMPLE 2

Figure 11:
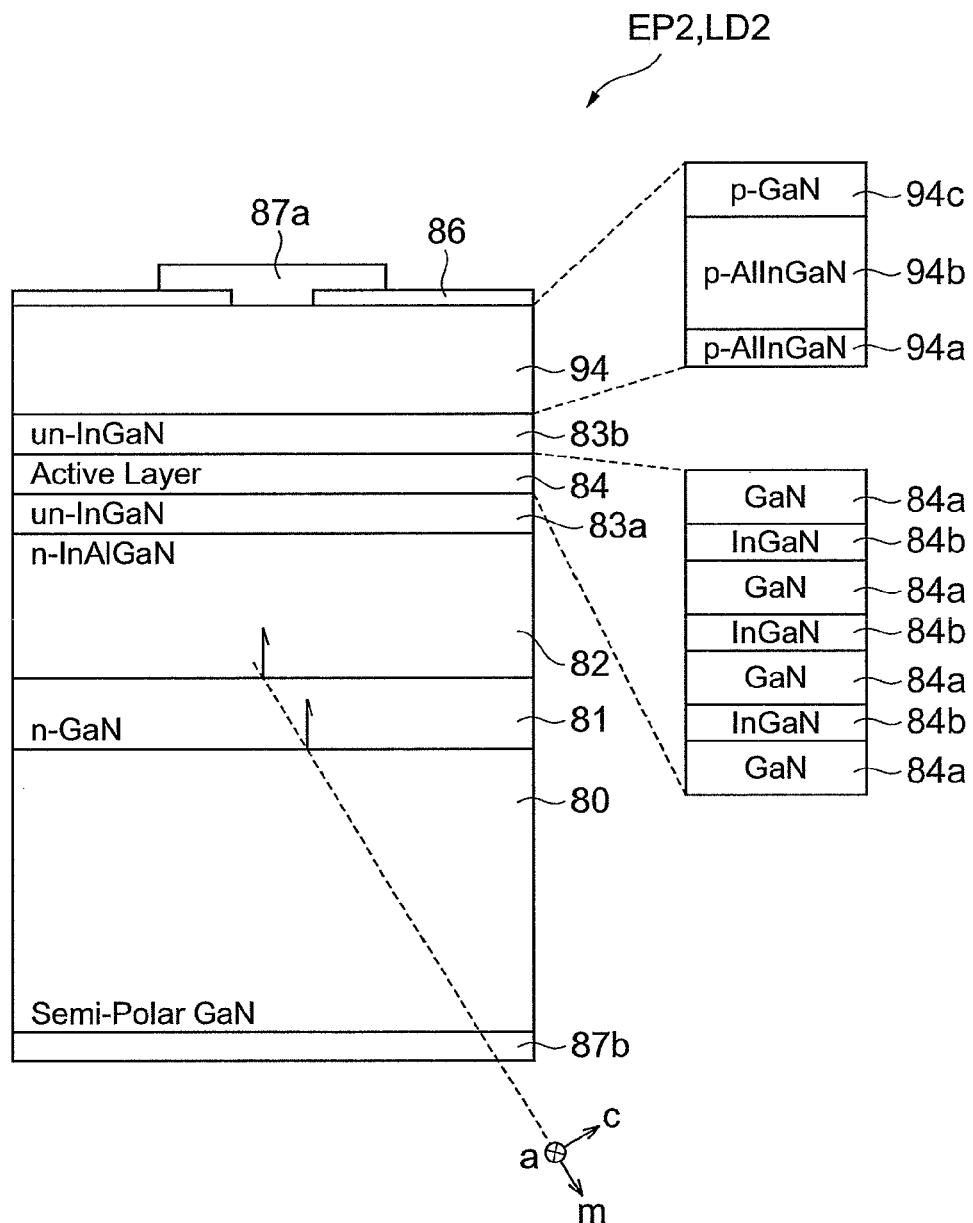
FIG. 11 is a drawing schematically showing a semiconductor laser structure including n-type and p-type InAlGaN cladding layers and an InAlGaN electron block layer made on a GaN substrate, in Example 2.

Similarly, a semipolar GaN substrate 80 having a primary surface of (20-21) plane is prepared. An epitaxial multilayer structure for a semiconductor laser structure shown in FIG. 11 is made on this GaN substrate 80 by organometallic vapor-phase epitaxy. In the epitaxial multilayer structure, instead of the p-type GaN-based semiconductor region 85, a p-type GaN-based semiconductor region 94 is grown on the light emitting layer at 840 Celsius degrees. In growth of the p-type GaN-based semiconductor region 94, an $In_{0.02}Al_{0.16}Ga_{0.82}N$ electron block layer 94a, a Mg-doped p-type $In_{0.02}Al_{0.09}Ga_{0.89}N$ cladding layer 94b, and a Mg-doped p-type GaN layer 94c are grown in this order. For example, the lattice mismatch rate of $In_{0.02}Al_{0.16}Ga_{0.82}N$ is about 0.27% and $In_{0.02}Al_{0.09}Ga_{0.89}N$ is almost lattice-matched with GaN. The thickness of the electron block layer 94a is 20 nm, the thickness of the p-type cladding layer 94b is 400 nm, and the thickness of the p-type contact layer 94c is 50 nm. Use of quaternary InAlGaN permits the growth of the electron block layer with good crystallinity at a relatively low growth temperature. Since the p-type GaN-based semiconductor region 94 can be grown at the growth temperature lower than 1000 Celsius degrees, thermal stress on the light emitting layer can be reduced.

The silicon oxide film 86 having the stripe window 10 μm wide is formed on an epitaxial substrate EP2, and thereafter a Ni/Au electrode is formed on the top surface of the p-type GaN-based semiconductor region 94. The Ti/Al electrode 87b is formed on the polished back surface of the GaN substrate 80. A substrate product is fabricated through these steps. After the formation of the electrodes, this substrate product is cleaved along a-planes with a space of 800 μM, thereby forming an optical cavity. A dielectric multilayer film of $SiO_2/TiO_2$ is formed on the cleaved end faces, thereby fabricating a gain guiding type semiconductor laser LD2. The threshold current of the gain guiding type semiconductor laser LD2 is 600 mA. The reasons for the low threshold current are as follows: dislocations are reduced by almost lattice-matching the p-type cladding layer with GaN; thermal damage to the light emitting layer is reduced by growing the p-type semiconductor region on the light emitting layer at the low growth temperature nearly equal to that of the light emitting layer.

Misfit dislocations will be described with reference to FIG. 10. The semiconductor laser LDC has junctions JC1-JC6.

The junctions JC1-JC3 will be described below. The misfit dislocations are most likely to be introduced at the junction JC1 and most unlikely to be introduced at the junction JC3 among the junctions JC1 to JC3. According to lattice constant differences at hetero interfaces, the lattice constant difference at the junction JC2 is the largest among the junctions JC1 to JC3, but because the n-type AlGaN layer 89 is thick and the Al—N bond in AlGaN is strong, misfit dislocations are more likely to be introduced at the junction JC1. The dislocation density at the junction JC1 is, for example, not less than $10^5$ $cm^{-1}$.

Because of the inclination of the c-axis in the n-type AlGaN layer on the semipolar plane, the c-plane serves as the most active slip plane. For this reason, at the junction JC1 the lattice relaxation is likely to occur in the plane defined by the m-axis and the c-axis and unlikely to occur in the plane defined by the a-axis and the c-axis. Therefore, misfit dislocations extend in the direction of the a-axis. Accordingly, anisotropic lattice relaxation occurs.

The introduction of misfit dislocation causes lattice relaxation in the n-type AlGaN layer. The strain in the n-type AlGaN layer is released in part, and this n-type AlGaN layer has the lattice constant close to the lattice constant intrinsic to the Al composition. Namely, the lattice constant of underlying AlGaN below the light emitting layer becomes smaller because of the lattice relaxation. This results in increasing compressive strain on the light emitting layer from the n-type AlGaN layer. It is considered that when misfit dislocations are introduced to the junction JC1, the compressive strain to the light emitting layer reduces the luminous efficiency.

The junctions JC2 and JC3 are close to the light emitting layer and the dislocations at the junctions JC2 and JC3 act as non-emission centers, so as to reduce the luminous efficiency and injection efficiency of carries.

When the quaternary InAlGaN layer is used instead of the n-type AlGaN cladding layer, the misfit dislocation density at the junction between the quaternary InAlGaN layer and the underlying GaN layer is reduced to not more than $5 \times 10^4$ cm$^{-1}$.

The junctions JC4 to JC6 will be described below. The misfit dislocations are most likely to be introduced at the junction JC5 and most unlikely to be introduced at the junction JC6 among the junctions JC4 to JC6. Since a lattice constant difference at a hetero interface is large, the misfit dislocations are likely to be introduced at the junction JC5. The electron block layer shown in FIG. 10 is not lattice-matched with GaN. For this reason, the dislocation density at the junction JC5 was, for example, not less than $1.5 \times 10^5$ cm$^{-1}$.

In the p-type semiconductor region, misfit dislocations are introduced at the junction JC5 near the light emitting layer. When these dislocations act as non-emission centers, they reduce the luminous efficiency and injection efficiency of carriers.

When the p-type quaternary InAlGaN cladding layer is used instead of the p-type AlGaN cladding layer as well as the InAlGaN electron block layer, the lattice constant of the p-type cladding layer can be made closer to that of GaN. For example, when the p-type cladding layer is lattice-matched with GaN, the misfit dislocation density at the junction between the p-type quaternary InAlGaN cladding layer and the quaternary InAlGaN electron block layer can be reduced to not more than $5 \times 10^4$ cm$^{-1}$. When the quaternary InAlGaN electron block layer is lattice-matched with GaN, the misfit dislocation density can be further reduced at the junction between the p-type quaternary InAlGaN cladding layer and the quaternary InAlGaN electron block layer.

EXAMPLE 3

Figure 12:
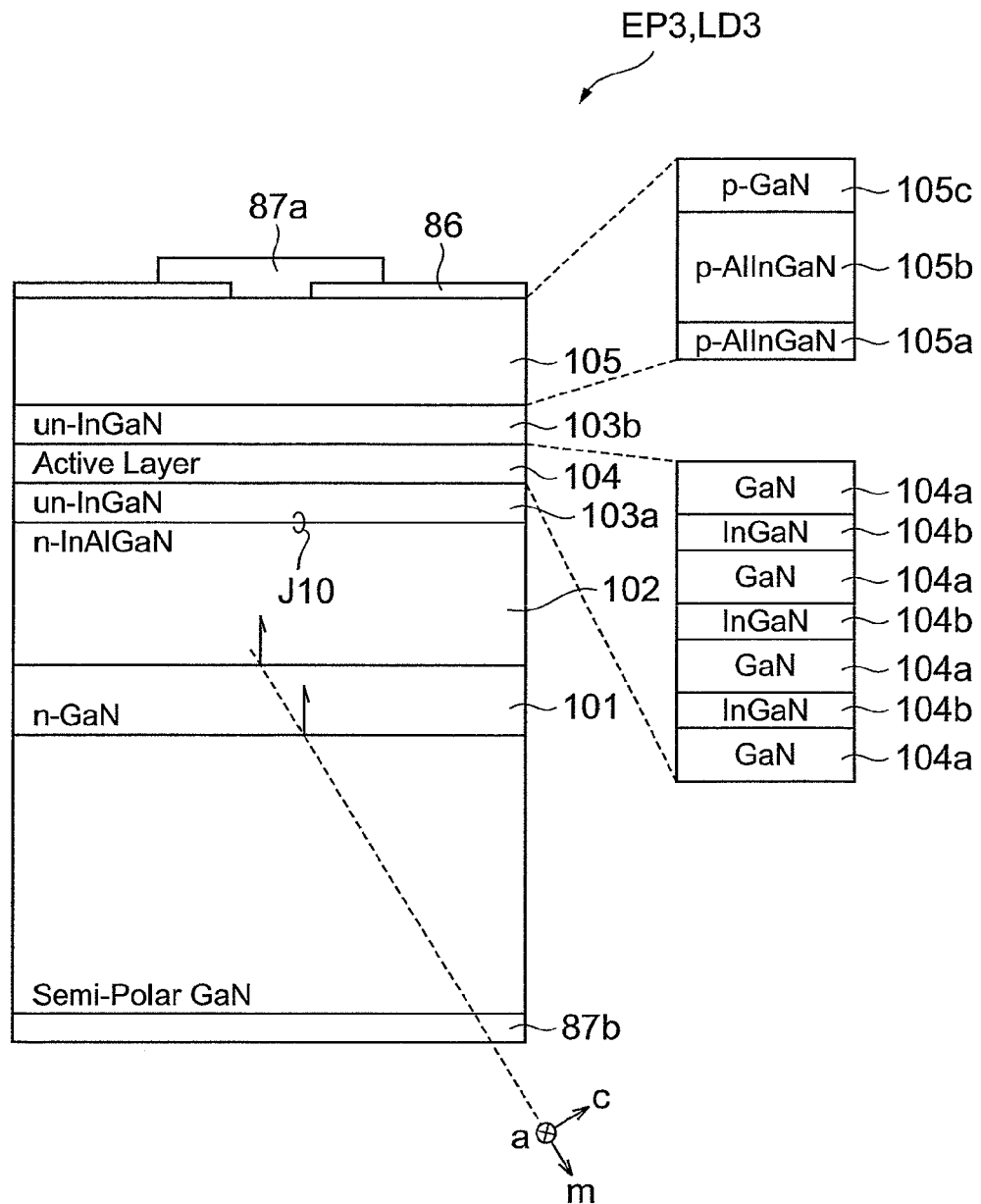
FIG. 12 is a drawing schematically showing a semiconductor laser structure including an n-type InAlGaN cladding layer made on a GaN substrate, in Example 3.

A 520 nm band laser structure was fabricated on a semipolar GaN substrate having a primary surface of (20-21) plane. A semipolar GaN substrate 80 having the primary surface of (20-21) plane was prepared as in the foregoing examples. An epitaxial multilayer structure EP3 for a semiconductor laser structure LD3 shown in FIG. 12 is made on this GaN substrate 80 by organometallic vapor-phase epitaxy. The semipolar GaN substrate 80 is thermally treated at 1050 Celsius degrees in an atmosphere of ammonia and hydrogen for ten minutes, and thereafter the epitaxial multilayer structure EP3 is fabricated as described below. A Si-doped n-type GaN layer 101 is grown on the semipolar GaN substrate 80. The thickness of the layer is 500 nm. Next, the substrate temperature is changed to 840 Celsius degrees and then an $In_{0.02}Al_{0.09}Ga_{0.89}N$ cladding layer 102 is grown on the Si-doped n-type GaN layer 101. The thickness of this cladding layer 102 is 1.5 $In_{0.02}Al_{0.09}Ga_{0.89}N$ is almost lattice-matched with GaN. After this, the light emitting layer is grown thereon. At 840 Celsius degrees, an undoped $In_zGa_{1-z}N$ optical guide layer 103a is grown on the n-type $In_{0.02}Al_{0.09}Ga_{0.89}N$ layer 102. The optical guide layer 103a is grown in some In compositions. The thickness of this optical guide layer 103a is 200 nm. An active layer 104 is formed on this optical guide layer 103a. First, at the substrate temperature of 840 Celsius degrees, a GaN barrier layer 104a is grown on the undoped InGaN layer 103a. The thickness of this barrier layer 104a is 15 nm. Next, at the substrate temperature of 740 Celsius degrees, an undoped $In_{0.30}Ga_{0.70}N$ well layer 104b is grown on the GaN barrier layer 104a. The thickness of this well layer 104b is 3 nm. If necessary, the growth of the barrier layer 104a and well layer 104b is repeated in the same manner to form the active layer 104. Next, at 840 Celsius degrees, an undoped $In_zGa_{1-z}N$ optical guide layer 103b is grown on the active layer 84. The thickness of this optical guide layer 103b is 200 nm. After the substrate temperature is changed to 1000 Celsius degrees, a p-type GaN-based semiconductor region 105 is grown on the optical guide layer 103b. First, an $Al_{0.12}Ga_{0.88}N$ electron block layer 105a is grown on the optical guide layer 103b. The thickness of the electron block layer 105a is 20 nm. After the substrate temperature was changed to 840 Celsius degrees, a Mg-doped p-type $In_{0.02}Al_{0.09}Ga_{0.89}N$ cladding layer 105b is grown on the electron block layer 105a. The thickness of this layer is 400 nm. Next, a Mg-doped p-type GaN contact layer 105c is grown on the p-type cladding layer 105b. The thickness of this layer is 50 nm. The epitaxial substrate EP3 is fabricated through these steps.

Figure 13:
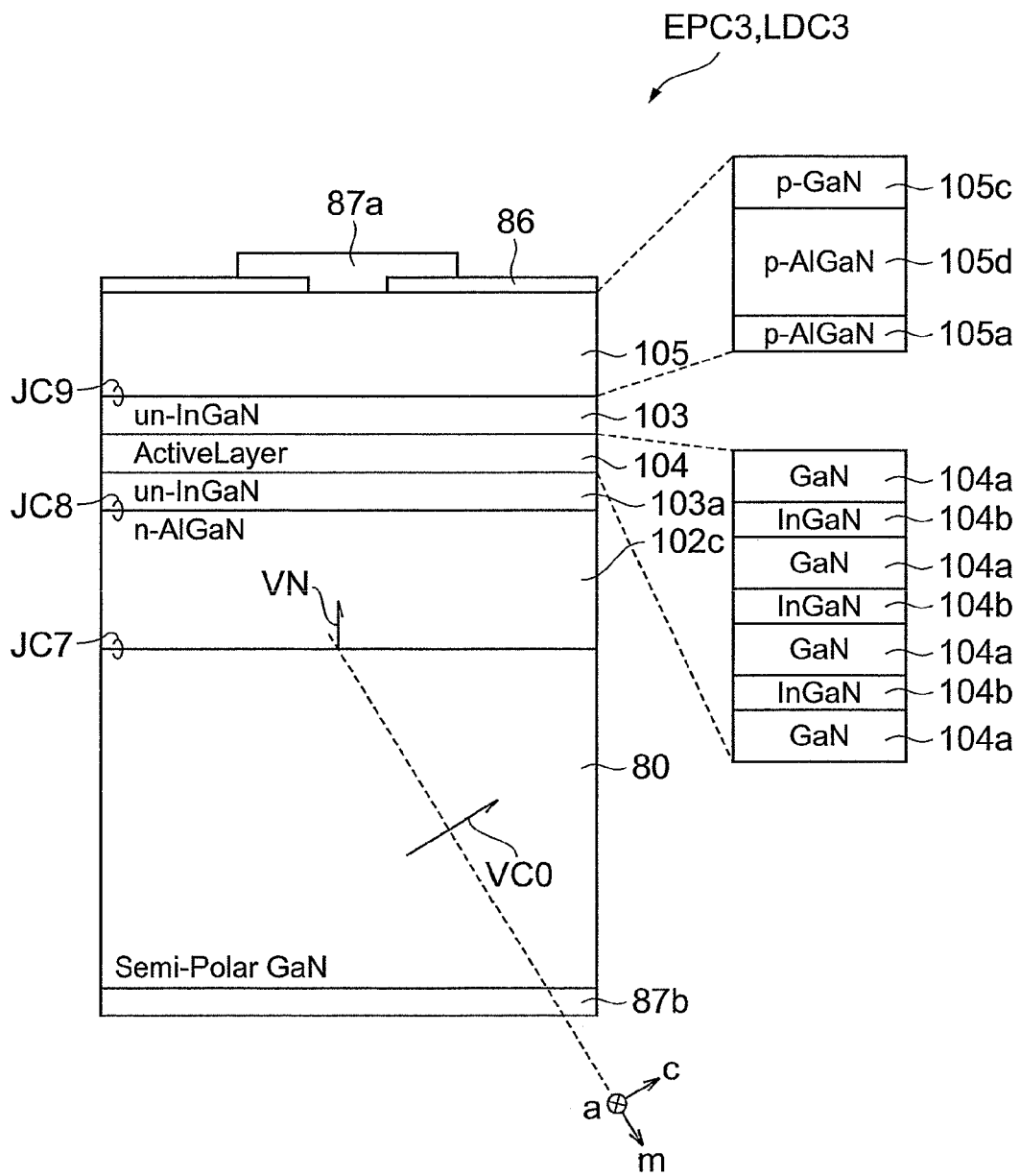
FIG. 13 is a drawing schematically showing a semiconductor laser structure including an n-type AlGaN cladding layer made on a GaN substrate.

Furthermore, an epitaxial multilayer structure EPC3 for a semiconductor laser structure LDC3 shown in FIG. 13 is made on the GaN substrate 80 by organometallic vapor-phase epitaxy. In the fabrication of this epitaxial multilayer structure EPC3, instead of the $In_{0.02}Al_{0.09}Ga_{0.89}N$ cladding layer 102, an $Al_{0.06}Ga_{0.94}N$ cladding layer 102c is grown on the GaN substrate 80. Furthermore, instead of the Mg-doped p-type $In_{0.02}Al_{0.09}Ga_{0.89}N$ cladding layer 105b, a Mg-doped p-type $Al_{0.06}Ga_{0.94}N$ cladding layer 105d is grown on the electron block layer 105a.

The silicon oxide film 86 having the stripe window 10 μm wide is formed on each of the epitaxial substrates EP3, EPC3 and thereafter the Ni/Au electrode is formed on the top surface of the p-type GaN-based semiconductor region 94. The Ti/Al electrode 87b is formed on the polished back surface of the GaN substrate 80. Substrate products are fabricated through these steps. After the formation of the electrodes, each substrate product is cleaved along a-planes with a space of 800 μm, thereby forming an optical cavity. A dielectric multilayer film of $SiO_2/TiO_2$ is formed on the cleaved end faces, thereby fabricating gain guiding type semiconductor lasers LD3, LDC3.

Figure 14:
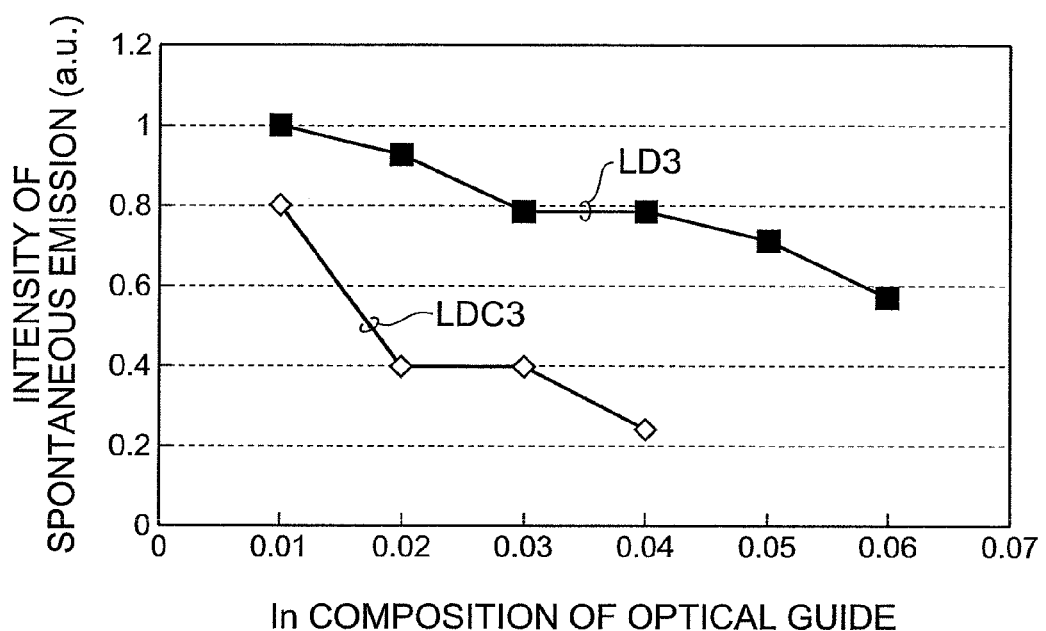
FIG. 14 is a drawing showing a relation of In composition of an optical guide layer versus intensity of spontaneous emission.

Spontaneous emission (emission in the LED mode) of the semiconductor lasers LD3, LDC3 is measured. FIG. 14 is a drawing showing a relation of In composition of the optical guide layer versus intensity of spontaneous emission.
In composition, LD3, LDC3:
0.01, 1.00, 0.80;
0.02, 0.93, 0.40;
0.03, 0.79, 0.40;
0.04, 0.79, 0.24;
0.05, 0.71;
0.06, 0.57.
With increase in the In composition of the optical guide layer, the intensity of spontaneous emission decreases. The reduction in intensity of the semiconductor laser LD3 is smaller than the reduction in intensity of the semiconductor laser LDC3. This difference can be understood as follows. It is conceivably because the AlGaN cladding layer is lattice-relaxed in the semiconductor laser LDC3 and the lattice mismatch becomes larger in the AlGaN layer than in the InAlGaN layer, with increase in the In composition of the optical guide layer. The misfit dislocation densities in the epitaxial multilayer structures EP3, EPC3 are measured by cross-sectional TEM. They are as follows:
Junction JC7: $2 \times 10^5$ cm$^{-1}$;
Junction JC8: $2 \times 10^5$ cm$^{-1}$;
Junction JC9: $5 \times 10^5$ cm$^{-1}$;
Junction JC10: $2 \times 10^4$ cm$^{-1}$.

The principle of the present invention has been illustrated and explained in the preferred embodiments, but it is recognized by those skilled in the art that the present invention can be modified in arrangement and detail without departing from the principle. The present invention is by no means limited to the specific configurations disclosed in the embodiments. Therefore, we claims all modifications and changes falling within the scope of claims and coming from the scope of spirit thereof.

| List of Reference Symbols | |
|---|---|
| 10 | growth reactor; |
| 11 | nitride semiconductor light emitting device; |
| 13 | support base; |
| 13a | semipolar primary surface; |
| 15 | n-type GaN-based semiconductor layer; |
| 17 | light emitting layer; |
| 19 | p-type GaN-based semiconductor layer; |
| 23 | quantum well structure; |
| 23a | well layers; 23b barrier layers; |
| VN | normal vector; |
| Cx | reference axis; |
| α | angle of inclination; |
| 21 | $In_{X1}Al_{Y1}Ga_{1-X1-Y1}N$ layer; |
| 27 | electron block layer; |
| 29 | p-type GaN-based semiconductor layer; |
| D21 | thickness of InAlGaN layer; |
| D23 | thickness of quantum well structure; |
| Sc1, Sc2, and Sc3 | c-planes; |
| Ax | normal axis; |
| 31 | active layer; |
| 33 | p-type GaN-based semiconductor cladding layer; |
| 35 | p-type GaN-based semiconductor contact layer; |
| 37 and 39 | optical guide layers; |
| J1, J2, and J3 | junctions; |
| LVC0, LVC1, LVC2, and LVC3 | lattice vectors; |
| 41 and 45 | electrodes; |
| 43 | insulator layer; |
| 51 | GaN substrate; |
| 51a | semipolar primary surface; |
| 53 | n-type GaN-based semiconductor region; |
| 55 | n-type GaN layer; |
| 57 | InAlGaN layer; |
| 59 | light emitting layer; |
| 61 | optical guide layer; |
| 63 | active layer; |
| 65 | optical guide layer; |
| 67 | electron block layer; |
| 69 | p-type cladding layer; |
| 71 | p-type contact layer. |

The invention claimed is:

1. A nitride semiconductor light emitting device comprising:
   a support base comprising a hexagonal gallium nitride, the support base including a semipolar primary surface inclined with respect to a plane perpendicular to a c-axis of the hexagonal gallium nitride;
   a light emitting layer provided on the support base, the light emitting layer comprising a gallium nitride-based semiconductor;
   an $In_{X1}Al_{Y1}Ga_{1-X1-Y1}N$ (0<X1<1, 0<Y1<1, X1+Y1<1) layer provided between the support base and the light emitting layer; and
   a p-type gallium nitride-based semiconductor layer, the support base, the $In_{X1}Al_{Y1}Ga_{1-X1-Y1}N$ layer, the light emitting layer, and the p-type gallium nitride-based semiconductor layer being arranged in order along a normal axis to the semipolar surface of the support base,
   the light emitting layer having a quantum well structure, the quantum well structure comprising an InGaN layer,
   a thickness of the $In_{X1}Al_{Y1}Ga_{1-X1-Y1}N$ layer being larger than a thickness of the quantum well structure,
   a bandgap of the $In_{X1}Al_{Y1}Ga_{1-X1-Y1}N$ layer being not less than a bandgap of the hexagonal gallium nitride,
   the $In_{X1}Al_{Y1}Ga_{1-X1-Y1}N$ layer being doped with an n-type dopant, and
   a c-plane of the $In_{X1}Al_{Y1}Ga_{1-X1-Y1}N$ layer being inclined with respect to the normal axis.

2. The nitride semiconductor light emitting device according to claim 1,
   wherein a c-axis direction in the hexagonal gallium nitride and a magnitude of a lattice constant d0 thereof in the c-axis direction thereof are represented by a lattice vector LVC0,
   wherein a c-axis direction of a semiconductor material for the $In_{X1}Al_{Y1}Ga_{1-X1-Y1}N$ layer and a magnitude of a lattice constant d1 thereof in the c-axis direction thereof are represented by a lattice vector LVC1,
   wherein the lattice vector LVC0 has a longitudinal component $V0_L$ in a direction of the normal axis and a transverse component $V0_T$ perpendicular to the longitudinal component,
   wherein the lattice vector LVC1 has a longitudinal component $V1_L$ in the direction of the normal axis and a transverse component $V1_T$ perpendicular to the longitudinal component,
   wherein a lattice mismatch degree in a transverse direction $(V1_T - V0_T)/V0_T$ is not less than −0.15%, and
   wherein the lattice mismatch degree $(V1_T - V0_T)/V0_T$ is not more than 0.2%.

3. The nitride semiconductor light emitting device according to claim 2,
   wherein the lattice mismatch degree $(V1_T - V0_T)/V0_T$ is not more than 0%,
   wherein a direction of inclination of the semipolar primary surface is a direction from the c-axis of the hexagonal gallium nitride to one of an a-axis and an m-axis of the hexagonal gallium nitride,
   wherein a direction of a first crystal axis of the hexagonal gallium nitride and a magnitude of a lattice constant d0N of the hexagonal gallium nitride in the direction of the first crystal axis are represented by a lattice vector LVN0, and the first crystal axis is another of the a-axis and the m-axis,
   wherein a direction of a second crystal axis of the semiconductor material for the $In_{X1}Al_{Y1}Ga_{1-X1-Y1}N$ layer and a magnitude of a lattice constant d1N of the semiconductor material for the $In_{X1}Al_{Y1}Ga_{1-X1-Y1}N$ layer in the direction of the second crystal axis are represented by a lattice vector LVN1, and the second crystal axis is another of the a-axis and the m-axis,
   wherein the lattice vector LVN0 has a longitudinal component $V0N_L$ in the direction of the normal axis and a transverse component $V0N_T$ perpendicular to the longitudinal component,
   wherein the lattice vector LVN1 has a longitudinal component $V1N_L$ in the direction of the normal axis and a transverse component $V1N_T$ perpendicular to the longitudinal component,
   wherein a lattice mismatch degree in a transverse direction $(V1N_T - V0N_T)/V0N_T$ is not less than 0%, and wherein the lattice mismatch degree $(V1N_T-V0N_T)/V0N_T$ is not more than 0.2%.

4. The nitride semiconductor light emitting device according to claim 1,
wherein a direction of inclination of the semipolar primary surface is a direction from the c-axis of the hexagonal gallium nitride to one of an a-axis and an m-axis of the hexagonal gallium nitride,
wherein a direction of a first crystal axis of the hexagonal gallium nitride and a magnitude of a lattice constant d0N of the hexagonal gallium nitride in the direction of the first crystal axis are represented by a lattice vector LVN0, and the first crystal axis is another of the a-axis and the m-axis,
wherein a direction of a second crystal axis of a semiconductor material for the $In_{X1}Al_{Y1}Ga_{1-X1-Y1}N$ layer and a magnitude of a lattice constant d1N of the semiconductor material for the $In_{X1}Al_{Y1}Ga_{1-X1-Y1}N$ layer in the direction of the second crystal axis are represented by a lattice vector LVN1, and the second crystal axis is another of the a-axis and the m-axis,
wherein the lattice vector LVN0 has a longitudinal component $V0N_L$ in a direction of the normal axis and a transverse component $V0N_T$ perpendicular to the longitudinal component,
wherein the lattice vector LVN1 has a longitudinal component $V1N_L$ in the direction of the normal axis and a transverse component $V1N_T$ perpendicular to the longitudinal component,
wherein a lattice mismatch degree in a transverse direction $(V1N_T-V0N_T)/V0N_T$ is not less than −0.15%, and
wherein the lattice mismatch degree $(V1N_T-V0N_T)/V0N_T$ is not more than 0.2%.

5. The nitride semiconductor light emitting device according to claim 1, wherein a direction of inclination of the semipolar primary surface is a direction from the c-axis of the hexagonal gallium nitride to an a-axis of the hexagonal gallium nitride.

6. The nitride semiconductor light emitting device according to claim 1, wherein a direction of inclination of the semipolar primary surface is a direction from the c-axis of the hexagonal gallium nitride to an m-axis of the hexagonal gallium nitride.

7. The nitride semiconductor light emitting device according to claim 1,
wherein a c-axis direction in the hexagonal gallium nitride and a magnitude of a lattice constant d0 thereof in the c-axis direction are represented by a lattice vector LVC0,
wherein a c-axis direction of a semiconductor material for the $In_{X1}Al_{Y1}Ga_{1-X1-Y1}N$ layer and a magnitude of a lattice constant d1 of the semiconductor material for the $In_{X1}Al_{Y1}Ga_{1-X1-Y1}N$ layer in the c-axis direction are represented by a lattice vector LVC1,
wherein the lattice vector LVC0 has a longitudinal component $V0_L$ in a direction of the normal axis and a transverse component $V0_T$ perpendicular to the longitudinal component,
wherein the lattice vector LVC1 has a longitudinal component $V1_L$ in the direction of the normal axis and a transverse component $V1_T$ perpendicular to the longitudinal component,
wherein a lattice mismatch degree in a transverse direction $(V1_T-V0_T)/V0_T$ is not less than −0.15%,
wherein the lattice mismatch degree $(V1_T-V0_T)/V0_T$ is not more than 0%,
wherein a direction of a crystal axis perpendicular to the normal axis and the c-axis of the hexagonal gallium nitride, and a magnitude of a lattice constant d0N of the crystal axis thereof in the direction of the crystal axis are represented by a lattice vector LVN0,
wherein a direction of a crystal axis perpendicular to the normal axis and the c-axis of the semiconductor material for the $In_{X1}Al_{Y1}Ga_{1-X1-Y1}N$ layer, and a magnitude of a lattice constant d1N of the semiconductor material for the $In_{X1}Al_{Y1}Ga_{1-X1-Y1}N$ layer in the direction of the crystal axis are represented by a lattice vector LVN1,
wherein the lattice vector LVN0 has a longitudinal component $V0N_L$ in a direction of the normal axis and a transverse component $V0N_T$ perpendicular to the longitudinal component,
wherein the lattice vector LVN1 has a longitudinal component $V1N_L$ in the direction of the normal axis and a transverse component $V1N_T$ perpendicular to the longitudinal component,
wherein a lattice mismatch degree in a transverse direction $(V1N_T-V0N_T)/V0N_T$ is not less than 0%, and
wherein the lattice mismatch degree $(V1N_T-V0N_T)/V0N_T$ is not more than 0.2%.

8. The nitride semiconductor light emitting device according to claim 1,
wherein an In composition X1 of the $In_{X1}Al_{Y1}Ga_{1-X1-Y1}N$ layer is not less than 0.01, and
wherein the In composition X1 of the $In_{X1}Al_{Y1}Ga_{1-X1-Y1}N$ layer is not more than 0.06.

9. The nitride semiconductor light emitting device according to claim 1,
wherein an Al composition Y1 of the $In_{X1}Al_{Y1}Ga_{1-X1-Y1}N$ layer is not less than 0.05, and
wherein the Al composition Y1 of the $In_{X1}Al_{Y1}Ga_{1-X1-Y1}N$ layer is not more than 0.30.

10. The nitride semiconductor light emitting device according to claim 1,
wherein a bandgap energy of the $In_{X1}Al_{Y1}Ga_{1-X1-Y1}N$ layer is not less than 3.51 electron volts, and
wherein the bandgap energy of the $In_{X1}Al_{Y1}Ga_{1-X1-Y1}N$ layer is not more than 3.63 electron volts.

11. The nitride semiconductor light emitting device according to claim 1,
wherein a thickness of the $In_{X1}Al_{Y1}Ga_{1-X1-Y1}N$ layer is not more than 3 μm, and
wherein the $In_{X1}Al_{Y1}Ga_{1-X1-Y1}N$ layer constitutes at least a part of an n-type cladding layer.

12. The nitride semiconductor light emitting device according to claim 1,
wherein the $In_{X1}Al_{Y1}Ga_{1-X1-Y1}N$ layer makes a first junction with the support base,
wherein the $In_{X1}Al_{Y1}Ga_{1-X1-Y1}N$ layer makes a second junction with the light emitting layer, and
wherein a misfit dislocation density at the first junction is less than $1 \times 10^5$ cm$^{-1}$.

13. The nitride semiconductor light emitting device according to claim 1, further comprising an $In_{X2}Al_{Y2}Ga_{1-X2-Y2}N$ (0<X2<1, 0<Y2<1, X2+Y2<1) layer provided between the p-type gallium nitride-based semiconductor layer and the light emitting layer,
wherein the $In_{X2}Al_{Y2}Ga_{1-X2-Y2}N$ layer is an electron block layer, and
wherein a c-plane of the $In_{X2}Al_{Y2}Ga_{1-X2-Y2}N$ layer is inclined relative to the normal axis.

14. The nitride semiconductor light emitting device according to claim 13,
wherein a c-axis direction of a semiconductor material for the $In_{X2}Al_{Y2}Ga_{1-X2-Y2}N$ layer and a magnitude of a lattice constant d2 thereof in the c-axis direction are represented by a lattice vector LVC2, wherein the lattice vector LVC2 has a longitudinal component $V2_L$ in a direction of the normal axis and a transverse component $V2_T$ perpendicular to the longitudinal component, wherein a lattice mismatch degree in a transverse direction $(V2_T-V0_T)/V0_T$ is not less than −0.5%, and wherein the lattice mismatch degree is not more than 0.2%.

15. The nitride semiconductor light emitting device according to claim 13, wherein a direction of inclination of the semipolar primary surface is a direction from the c-axis of the hexagonal gallium nitride to one of an a-axis and an m-axis of the hexagonal gallium nitride, wherein a direction of a first crystal axis of the hexagonal gallium nitride and a magnitude of a lattice constant d0N thereof in the direction of the first crystal axis are represented by a lattice vector LVN0, and the first crystal axis is another of the a-axis and the m-axis, wherein the lattice vector LVN0 has a longitudinal component $V0N_L$ in a direction of the normal axis and a transverse component $V0N_T$ perpendicular to the longitudinal component, wherein a direction of a first crystal axis of the semiconductor material for the $In_{X2}Al_{Y2}Ga_{1-X2-Y2}N$ layer and a magnitude of a lattice constant d2N thereof in the direction of the first crystal axis are represented by a lattice vector LVN2, and the first crystal axis is another of the a-axis and the m-axis, wherein the lattice vector LVN2 has a longitudinal component $V2N_L$ in the direction of the normal axis and a transverse component $V2N_T$ perpendicular to the longitudinal component, wherein a lattice mismatch degree in a transverse direction $(V2N_T-V0N_T)/V0N_T$ is not less than −0.5%, and wherein the lattice mismatch degree $(V2N_T-V0N_T)/V0N_T$ is not more than 0.2%.

16. The nitride semiconductor light emitting device according to claim 13, wherein a direction of inclination of the semipolar primary surface is a direction from the c-axis of the hexagonal gallium nitride to an a-axis of the hexagonal gallium nitride.

17. The nitride semiconductor light emitting device according to claim 13, wherein a direction of inclination of the semipolar primary surface is a direction from the c-axis of the hexagonal gallium nitride to an m-axis of the hexagonal gallium nitride.

18. The nitride semiconductor light emitting device according to claim 13, wherein a crystal axis direction perpendicular to the normal axis and the c-axis in the hexagonal gallium nitride, and a magnitude of a lattice constant d0N of the hexagonal gallium nitride in the crystal axis direction are represented by a lattice vector LVN0, wherein the lattice vector LVN0 has a longitudinal component $V0N_L$ in a direction of the normal axis and a transverse component $V0N_T$ perpendicular to the longitudinal component, wherein a crystal axis direction perpendicular to the normal axis and a c-axis of a semiconductor material for the $In_{X2}Al_{Y2}Ga_{1-X2-Y2}N$ layer, and a magnitude of a lattice constant d2N thereof in the crystal axis direction are represented by a lattice vector LVN2, wherein the lattice vector LVN2 has a longitudinal component $V2N_L$ in the direction of the normal axis and a transverse component $V2N_T$ perpendicular to the longitudinal component, wherein a lattice mismatch degree in a transverse direction $(V2N_T-V0N_T)/V0N_T$ is not less than −0.5%, and wherein the lattice mismatch degree $(V2N_T-V0N_T)/V0N_T$ is not more than 0.2%.

19. The nitride semiconductor light emitting device according to claim 1, further comprising an $In_{X3}Al_{Y3}Ga_{1-X3-Y3}N$ (0<X3<1, 0<Y3<1, X3+Y3<1) layer provided between the p-type gallium nitride-based semiconductor layer and the light emitting layer, wherein a thickness of the $In_{X3}Al_{Y3}Ga_{1-X3-Y3}N$ layer is not less than 300 nm, and wherein the $In_{X3}Al_{Y3}Ga_{1-X3-Y3}N$ layer constitutes at least a part of a p-type cladding layer.

20. The nitride semiconductor light emitting device according to claim 19, wherein a c-axis direction of a semiconductor material for the $In_{X3}Al_{Y3}Ga_{1-X3-Y3}N$ layer and a magnitude of a lattice constant d3 thereof in the c-axis direction are represented by a lattice vector LVC3, wherein the lattice vector LVC3 has a longitudinal component $V3_L$ in a direction of the normal axis and a transverse component $V3_T$ perpendicular to the longitudinal component, wherein a lattice mismatch degree in a transverse direction $(V3_T-V0_T)/V0_T$ is not less than −0.15%, and wherein the lattice mismatch degree is not more than 0.2%.

21. The nitride semiconductor light emitting device according to claim 20, wherein the lattice mismatch degree $(V3_T-V0_T)/V0_T$ is not more than 0%, wherein a direction of inclination of the semipolar primary surface is a direction from the c-axis of the hexagonal gallium nitride to one of an a-axis and an m-axis of the hexagonal gallium nitride, wherein a direction of a first crystal axis and a magnitude of a lattice constant d0N of the hexagonal gallium nitride in the direction of the first crystal axis are represented by a lattice vector LVN0, and the first crystal axis is another of the a-axis and the m-axis, wherein a direction of a third crystal axis of the semiconductor material for the $In_{X3}Al_{Y3}Ga_{1-X3-Y3}N$ layer and a magnitude of a lattice constant d3N of the semiconductor material for the $In_{X3}Al_{Y3}Ga_{1-X3-Y3}N$ layer in the direction of the third crystal axis are represented by a lattice vector LVN3, and the third crystal axis is another of the a-axis and the m-axis, wherein the lattice vector LVN0 has a longitudinal component $V0N_L$ in the direction of the normal axis and a transverse component $V0N_T$ perpendicular to the longitudinal component, wherein the lattice vector LVN3 has a longitudinal component $V3N_L$ in the direction of the normal axis and a transverse component $V3N_T$ perpendicular to the longitudinal component, wherein a lattice mismatch degree in the transverse direction $(V3N_T-V0N_T)/V0N_T$ is not less than 0%, and wherein the lattice mismatch degree $(V3N_T-V0N_T)/V0N_T$ is not more than 0.2%.

22. The nitride semiconductor light emitting device according to claim 20, wherein a direction of inclination of the semipolar primary surface is a direction from the c-axis of the hexagonal gallium nitride to one of an a-axis and an m-axis of the hexagonal gallium nitride, wherein a direction of a first crystal axis of the hexagonal gallium nitride and a magnitude of a lattice constant d0N thereof in the direction of the first crystal axis are represented by a lattice vector LVN0, and the first crystal axis is another of the a-axis and the m-axis, wherein a direction of a third crystal axis of the semiconductor material for the $In_{X3}Al_{Y3}Ga_{1-X3-Y3}N$ layer and a magnitude of a lattice constant d3N thereof in the direction of the third crystal axis are represented by a lattice vector LVN3, and the third crystal axis is another of the a-axis and the m-axis, wherein the lattice vector LVN0 has a longitudinal component $V0N_L$ in the direction of the normal axis and a transverse component $V0N_T$ perpendicular to the longitudinal component, wherein the lattice vector LVN3 has a longitudinal component $V3N_L$ in the direction of the normal axis and a transverse component $V3N_T$ perpendicular to the longitudinal component, wherein a lattice mismatch degree in a transverse direction $(V3N_T-V0N_T)/V0N_T$ is not less than −0.15%, and wherein the lattice mismatch degree $(V3N_T-V0N_T)/V0N_T$ is not more than 0.2%.

23. The nitride semiconductor light emitting device according to claim 21, wherein the direction of inclination of the semipolar primary surface is a direction from the c-axis of the hexagonal gallium nitride to the a-axis of the hexagonal gallium nitride.

24. The nitride semiconductor light emitting device according to claim 21, wherein the direction of inclination of the semipolar primary surface is a direction from the c-axis of the hexagonal gallium nitride to the m-axis of the hexagonal gallium nitride.

25. The nitride semiconductor light emitting device according to claim 20, wherein a c-axis direction of the hexagonal gallium nitride and a magnitude of a lattice constant d0 of the hexagonal gallium nitride in the c-axis direction are represented by a lattice vector LVC0, wherein a c-axis direction of the semiconductor material for the $In_{X3}Al_{Y3}Ga_{1-X3-Y3}N$ layer and a magnitude of the lattice constant d3 thereof in the c-axis direction are represented by the lattice vector LVC3, wherein the lattice vector LVC0 has a longitudinal component $V0_L$ in the direction of the normal axis and a transverse component $V0_T$ perpendicular to the longitudinal component, wherein the lattice vector LVC3 has the longitudinal component $V3_L$ in the direction of the normal axis and the transverse component $V3_T$ perpendicular to the longitudinal component, wherein a lattice mismatch degree in a transverse direction $(V3_T-V0_T)/V0_T$ is not less than −0.15%, wherein the lattice mismatch degree $(V3_T-V0_T)/V0_T$ is not more than 0%, wherein a direction of a crystal axis perpendicular to the normal axis and the c-axis of the hexagonal gallium nitride, and a magnitude of a lattice constant d0N of the hexagonal gallium nitride in the direction of the crystal axis are represented by a lattice vector LVN0, wherein a direction of a crystal axis perpendicular to the normal axis and the c-axis of the semiconductor material for the $In_{X3}Al_{Y3}Ga_{1-X3-Y3}N$ layer, and a magnitude of a lattice constant d3N thereof in the direction of the crystal axis are represented by a lattice vector LVN3, wherein the lattice vector LVN0 has a longitudinal component $V0N_L$ in the direction of the normal axis and a transverse component $V0N_T$ perpendicular to the longitudinal component, wherein the lattice vector LVN3 has a longitudinal component $V3N_L$ in the direction of the normal axis and a transverse component $V3N_T$ perpendicular to the longitudinal component, wherein a lattice mismatch degree in the transverse direction $(V3N_T-V0N_T)/V0N_T$ is not less than 0%, and wherein the lattice mismatch degree $(V3N_T-V0N_T)/V0N_T$ is not more than 0.2%.

26. The nitride semiconductor light emitting device according to claim 1, wherein the light emitting layer comprises an active layer and an optical guide layer, wherein the optical guide layer is provided between the $In_{X1}Al_{Y1}Ga_{1-X1-Y1}N$ layer and the active layer, and wherein the active layer includes the quantum well structure.

27. The nitride semiconductor light emitting device according to claim 26, wherein the optical guide layer includes an InGaN layer and an In composition of the InGaN layer is not less than 0.02 and not more than 0.06.

28. The nitride semiconductor light emitting device according to claim 27, wherein a misfit dislocation density at an interface between the InGaN layer of the optical guide layer and a semiconductor layer which is located between the support base and the InGaN layer of the optical guide layer is not more than $1\times10^5$ cm$^{-1}$.

29. The nitride semiconductor light emitting device according to claim 27, wherein a misfit dislocation density at an interface between the InGaN layer of the optical guide layer and a semiconductor layer located between the support base and the InGaN layer of the optical guide layer is not less than $5\times10^3$ cm$^{-1}$.

30. The nitride semiconductor light emitting device according to claim 26, wherein the light emitting layer further comprises another optical guide layer, and the other optical guide layer is provided between the $In_{X2}Al_{Y2}Ga_{1-X2-Y2}N$ layer and the active layer.

31. The nitride semiconductor light emitting device according to claim 30, wherein the other optical guide layer includes an InGaN layer and an In composition of the InGaN layer is not less than 0.02 and not more than 0.06.

32. The nitride semiconductor light emitting device according to claim 1, wherein the light emitting layer is provided so as to emit light in a wavelength range of not less than 400 nm and not more than 550 nm.

33. The nitride semiconductor light emitting device according to claim 1, wherein an angle of inclination of the semipolar primary surface is in a range of not less than 10 degrees and not more than 80 degrees and not less than 100 degrees and not more than 170 degrees.

34. The nitride semiconductor light emitting device according to claim 1, wherein an angle of inclination of the semipolar primary surface is in a range of not less than 63 degrees and not more than 80 degrees and not less than 100 degrees and not more than 117 degrees.

35. An epitaxial substrate for a nitride semiconductor light emitting device, the epitaxial substrate comprising:

a substrate comprising a hexagonal gallium nitride and, the substrate including a semipolar primary surface inclined with respect to a plane perpendicular to a c-axis of the hexagonal gallium nitride;

a light emitting layer provided on the substrate, the light emitting layer comprising a gallium nitride-based semiconductor;

an $In_{X1}Al_{Y1}Ga_{1-X1-Y1}N$ ($0<X1<1$, $0<Y1<1$, $X1+Y1<1$) layer provided between the substrate and the light emitting layer; and a p-type gallium nitride-based semiconductor layer, the substrate, the $In_{X1}Al_{Y1}Ga_{1-X1-Y1}N$ layer, the light emitting layer, and the p-type gallium nitride-based semiconductor layer being arranged in order along a normal axis to the semipolar surface of the substrate, the light emitting layer having a quantum well structure, and the quantum well structure comprising an InGaN layer, a thickness of the $In_{X1}Al_{Y1}Ga_{1-X1-Y1}N$ layer being larger than a thickness of the quantum well structure, a bandgap of the $In_{X1}Al_{Y1}Ga_{1-X1-Y1}N$ layer being not less than a bandgap of the hexagonal gallium nitride, the $In_{X1}Al_{Y1}Ga_{1-X1-Y1}N$ layer being doped with an n-type dopant, and a c-plane of the $In_{X1}Al_{Y1}Ga_{1-X1-Y1}N$ layer being inclined relative to the normal axis.

36. The epitaxial substrate according to claim 35,
wherein a c-axis direction of the hexagonal gallium nitride and a magnitude of a lattice constant d0 thereof in the c-axis direction are represented by a lattice vector LVC0,
wherein a c-axis direction of the $In_{X1}Al_{Y1}Ga_{1-X1-Y1}N$ layer and a magnitude of a lattice constant d1 thereof in the c-axis direction are represented by a lattice vector LVC1,
wherein the lattice vector LVC0 has a longitudinal component $V0_L$ in a direction of the normal axis and a transverse component $V0_T$ perpendicular to the longitudinal component,
wherein the lattice vector LVC1 has a longitudinal component $V1_L$ in the direction of the normal axis and a transverse component $V1_T$ perpendicular to the longitudinal component,
wherein a lattice mismatch degree in a transverse direction to the c-axis $(V1_T - V0_T)/V0_T$ is not less than $-0.15\%$, and
wherein the lattice mismatch degree is not more than 0.2%.

37. The epitaxial substrate according to claim 35, wherein an angle of inclination of the semipolar primary surface is in a range of not less than 10 degrees and not more than 80 degrees or in a range of not less than 100 degrees and not more than 170 degrees.

38. A method for fabricating a nitride semiconductor light emitting device, comprising the steps of:
preparing a substrate, the substrate comprising a hexagonal gallium nitride and having a semipolar primary surface inclined with respect to a plane perpendicular to a c-axis of the hexagonal gallium nitride;

growing an $In_{X1}Al_{Y1}Ga_{1-X1-Y1}N$ cladding ($0<X1<1$, $0<Y1<1$, $X1+Y1<1$) layer on the semipolar surface of the substrate while doping the $In_{X1}Al_{Y1}Ga_{1-X1-Y1}N$ cladding layer with an n-type dopant;

forming a light emitting layer on the $In_{X1}Al_{Y1}Ga_{1-X1-Y1}N$ cladding layer, the light emitting layer comprising a gallium nitride-based semiconductor;

growing an $In_{X2}Al_{Y2}Ga_{1-X2-Y2}N$ electron block ($0<X2<1$, $0<Y2<1$, $X2+Y2<1$) layer on the light emitting layer; and growing an $In_{X3}Al_{Y3}Ga_{1-X3-Y3}N$ cladding ($0<X3<1$, $0<Y3<1$, $X3+Y3<1$) layer on the $In_{X2}Al_{Y2}Ga_{1-X2-Y2}N$ electron block layer while doping the $In_{X3}Al_{Y3}Ga_{1-X3-Y3}N$ cladding layer with a p-type dopant, the light emitting layer having a quantum well structure and the quantum well structure comprising an InGaN layer, a thickness of the $In_{X1}Al_{Y1}Ga_{1-X1-Y1}N$ cladding layer being larger than a thickness of the quantum well structure, a bandgap of the $In_{X1}Al_{Y1}Ga_{1-X1-Y1}N$ cladding layer being not less than a bandgap of the hexagonal gallium nitride, a c-plane of the $In_{X1}Al_{Y1}Ga_{1-X1-Y1}N$ cladding layer being inclined relative to the normal axis, a c-plane of the $In_{X2}Al_{Y2}Ga_{1-X2-Y2}N$ electron block layer being inclined relative to the normal axis, and a c-plane of the $In_{X3}Al_{Y3}Ga_{1-X3-Y3}N$ cladding layer being inclined relative to the normal axis.

39. The method according to claim 38, further comprising the step of growing a p-type gallium nitride-based semiconductor layer on the $In_{X3}Al_{Y3}Ga_{1-X3-Y3}N$ cladding layer, wherein a growth temperature of the $In_{X2}Al_{Y2}Ga_{1-X2-Y2}N$ electron block layer is not less than 800 Celsius degrees and not more than 900 Celsius degrees, wherein a growth temperature of the $In_{X3}Al_{Y3}Ga_{1-X3-Y3}N$ cladding layer is not less than 800 Celsius degrees and not more than 900 Celsius degrees, and wherein a growth temperature of the p-type gallium nitride-based semiconductor layer is not less than 800 Celsius degrees and not more than 900 Celsius degrees.

* * * * *